United States Patent
Funyuu et al.

(10) Patent No.: US 9,337,429 B2
(45) Date of Patent: *May 10, 2016

(54) ORGANIC ELECTRONIC MATERIAL, INK COMPOSITION, AND ORGANIC ELECTRONIC ELEMENT

(71) Applicant: HITACHI CHEMICAL COMPANY, LTD., Tokyo (JP)

(72) Inventors: Shigeaki Funyuu, Tsuchiura (JP); Naoki Asano, Tsukuba (JP); Kenichi Ishitsuka, Tsukuba (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/361,783

(22) PCT Filed: Nov. 29, 2012

(86) PCT No.: PCT/JP2012/080922
§ 371 (c)(1),
(2) Date: May 30, 2014

(87) PCT Pub. No.: WO2013/081052
PCT Pub. Date: Jun. 6, 2013

(65) Prior Publication Data
US 2014/0332791 A1    Nov. 13, 2014

(30) Foreign Application Priority Data
Nov. 30, 2011    (JP) .................. 2011-262034

(51) Int. Cl.
*H01L 51/00* (2006.01)
*H01L 51/50* (2006.01)
*C08K 5/17* (2006.01)

(52) U.S. Cl.
CPC .......... *H01L 51/005* (2013.01); *H01L 51/0035* (2013.01); *H01L 51/0043* (2013.01); *H01L51/0096* (2013.01); *H01L 51/506* (2013.01); *C08K 5/17* (2013.01); *H01L 51/0004* (2013.01); *H01L 51/0036* (2013.01)

(58) Field of Classification Search
CPC .............. H01L 51/005; H01L 51/0035; H01L 51/0096; H01L 51/506; H01L 51/0043
USPC ........................................... 106/31.13, 31.92
See application file for complete search history.

(56) References Cited

U.S. PATENT DOCUMENTS

| | | | |
|---|---|---|---|
| 1,298,401 A | 3/1919 | Richardo | |
| 2009/0174311 A1 | 7/2009 | Patel et al. | |
| 2011/0042661 A1 | 2/2011 | Endo et al. | |
| 2012/0074360 A1* | 3/2012 | Funyuu et al. | 252/500 |
| 2012/0181530 A1 | 7/2012 | Funyuu et al. | |
| 2013/0037753 A1* | 2/2013 | Ishitsuka et al. | 252/500 |
| 2014/0051827 A1 | 2/2014 | Endo et al. | |

FOREIGN PATENT DOCUMENTS

| | | |
|---|---|---|
| CN | 1875054 A | 12/2006 |
| EP | 2270069 A1 | 1/2011 |
| JP | 59-199712 | 11/1984 |
| JP | 2006-233162 | 9/2006 |
| JP | 2007-520858 | 7/2007 |
| JP | 2012-126877 | 7/2012 |
| WO | WO 2005/059951 A1 | 6/2005 |
| WO | 2010/140553 A1 | 12/2010 |
| WO | 2011/040531 A1 | 4/2011 |
| WO | WO 2011/132702 A1 | 10/2011 |

OTHER PUBLICATIONS

M. A. Baldo, et al., "Highly efficient phosphorescent emission from organic electroluminescent devices", *Nature*, vol. 395, Sep. 10, 1998, pp. 151-154.

M. A. Baldo, et al., "High-efficiency fluorescent organic light-emitting devices using a phosphorescent sensitizer", *Nature*, vol. 403, Feb. 17, 2000, pp. 750-753.

C. Adachi, et al., "High-efficiency red electrophosphorescence devices", *Applied Physics Letters*, vol. 78, No. 11, Mar. 12, 2001, pp. 1622-1624.

M. A. Baldo et al., Very high-efficiency green organic light-emitting devices based on electrophosphorescence, Applied Physics Letters, Jul. 5, 1999, pp. 4-6, vol. 75, No. 1.

Official Action issued on Feb. 3, 2015 in the counterpart Japanese Application No. 2013-547211.

Communication mailed Aug. 18, 2015, for European Application No. 12853562.2, 6 pages.

Office Action mailed Nov. 19, 2015, for Korean Application No. 10-2014-7017662, together with English translation thereof.

Office action mailed Sep. 2, 2015, for counterpart Chinese Application No. 201280058862.9, together with English language translation thereof.

* cited by examiner

*Primary Examiner* — John Uselding

(74) *Attorney, Agent, or Firm* — Fitch, Even, Tabin & Flannery LLP

(57) ABSTRACT

Provided is an organic electronic material which is excellent in storage stability in the case as an ink composition, and able to prepare, at a high yield, an organic electronic element capable of reducing the driving voltage and of being driven stably for a long period of time, and an ink composition including the organic electronic material. The organic electronic material is characterized in that it contains at least an ionic compound represented by the following general formula (1), and a compound including a charge transporting unit, and the ink composition including the material. In the general formula (1), $R^a$ to $R^c$ each independently represent a hydrogen atom (H), an alkyl group, or a benzyl group. A represents an anion.

General Formula (1)

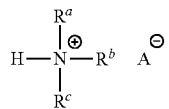

5 Claims, 1 Drawing Sheet

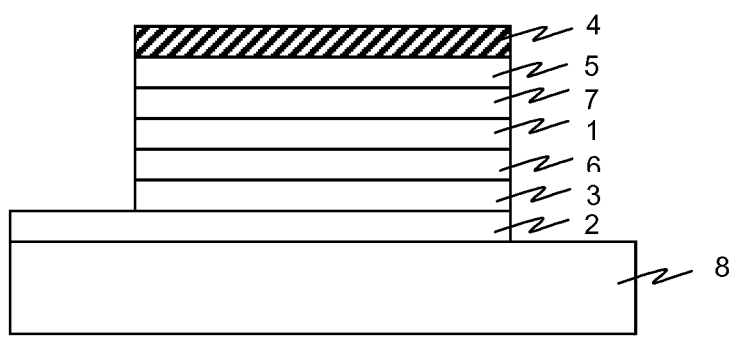

ORGANIC ELECTRONIC MATERIAL, INK COMPOSITION, AND ORGANIC ELECTRONIC ELEMENT

TECHNICAL FIELD

The present invention relates to an organic electronic material, an ink composition, an organic electronic element, and an organic electroluminescent element (hereinafter, also referred to as an organic EL element).

BACKGROUND ART

Organic electronic elements are elements intended for electrical operations with the use of organic matters, expected to be able to provide features such as energy conservation, low prices, and flexibility, and attracting attention as alternative techniques to conventional inorganic semiconductors mainly containing silicon.

Examples of the organic electronic elements include organic EL elements, organic photoelectric conversion elements, and organic transistors.

Among the organic electronic elements, the organic EL elements are attracting attention, for example, as alternatives to incandescent lamps and gas-filled lamps, and for use as large-area solid-state light sources. In addition, the organic EL elements are also attracting attention as most likely self-luminous displays in place of liquid crystal displays (LCD) in the field of flat panel display (FPD), and increasingly put into production.

In recent years, for the purpose of improving the organic EL elements in luminescent efficiency and lifetime, attempts have been made to use a charge transporting compound mixed with an electron-accepting compound.

For example, Patent Literature 1 discloses a composition composed of an ionic compound and a charge transporting compound, as a composition for charge transporting films.

However, these materials fail to sufficiently achieve effects such as reductions in driving voltage and improvements in luminescent efficiency and lifetime. Furthermore, the materials are low in thermal stability, deteriorated by baking in the preparation of organic EL elements or by driving organic EL elements, and the organic EL elements have problems of decreases in luminescent efficiency and lifetime and variations in characteristics of the organic EL elements. Moreover, there has been a problem that decomposition products resulting from the electron accepting compound in baking in the preparation of elements damage organic EL manufacturing devices, etc. to decrease the productivity.

On the other hand, the organic EL elements are classified roughly into two types of: low molecular weight-type organic EL elements and high molecular weight-type organic EL elements, according to materials and film forming methods used. The high molecular weight-type organic EL elements are essential elements to large-screen organic EL displays in the future, because organic materials are composed of high molecular weight materials, and able to be easily formed by printing, ink-jet printing, etc., as compared with the low molecular weight-type organic EL elements which require film formation in a vacuum system.

Both the low molecular weight-type organic EL elements and high molecular weight-type organic EL elements have been energetically researched, but still have the significant problem of being low in luminescent efficiency and short in element lifetime. As one means for solving this problem, multi-layered elements have been attempted for the low molecular weight-type organic EL elements.

FIG. 1 shows an example of a multi-layered organic EL element. In association with FIG. 1, a layer in charge of light emission is referred to as a light emitting layer 1, and in the case of including other layers, a layer in contact with an anode 2 is referred to as a hole injecting layer 3, and a layer in contact with a cathode 4 is referred to as an electron injecting layer 5. Furthermore, when there is a distinct layer between the light emitting layer 1 and the hole injecting layer 3, the distinct layer is referred to as a hole transporting layer 6, and furthermore, when there is a distinct layer between the light emitting layer 1 and the electron injecting layer 5, the distinct layer is referred to as an electron transporting layer 7. It is to be noted that reference numeral 8 denotes a substrate in FIG. 1.

For the low molecular weight-type organic EL elements, films are formed by a vapor deposition method, and multi-layered elements can be thus easily achieved by carrying out vapor deposition while sequentially changing compounds used. On the other hand, for the high molecular weight-type organic EL elements, films are formed with the use of a wet process such as printing or ink-jet printing, and a problem is thus caused which is that the lower layer is dissolved when the upper layer is applied. Therefore, it is difficult to achieve multi-layered high molecular weight-type organic EL elements, as compared with the low molecular weight-type organic EL elements, and it has not been possible to achieve the effect of improving the luminescent efficiency or improving the lifetime.

In order to address this problem, several methods have been ever proposed. One of the methods is a method of using a difference in solubility. For example, there is an element that has a two-layer structure of: a hole-injecting layer of water-soluble polythiophene:poly(styrene sulfonate) (PEDOT:PSS); and a light emitting layer formed with the use of an aromatic organic solvent such as toluene. In this case, the PEDOT:PSS layer is not dissolved in the aromatic solvent such as toluene, and it is thus possible to prepare the two-layer structure.

Patent Literature 2 discloses an element of three-layer structure, which has a layer referred to as an interlayer layer introduced on PEDOT:PSS.

These methods for multi-layers are important, but problematic in that the use of water-soluble PEDOT:PSS requires baking for a long period of time because of the need to remove water remaining in thin films, and that evaporated water damages manufacturing devices. In addition, there have been manufacturing problems such as the need for heating at high temperature for insolubilization of hole transporting layers, thus decreases in lifetime and luminescent efficiency of the organic EL elements due to material deterioration by the heating, and a step of rinsing dissolved matters for inadequate changes in solubility.

CITATION LIST

Patent Literature

Patent Literature 1: JP 2006-233162 A
Patent Literature 2: JP 2007-520858 A

SUMMARY OF INVENTION

Technical Problem

In view of the problems mentioned above, an object of the present invention is to provide an organic electronic material which is high in thermal stability, excellent in storage stability in the case as an ink composition, and able to prepare, at a high yield, an organic electronic element capable of reducing the driving voltage and of being driven stably for a long period of time, and an ink composition including the organic electronic material.

Furthermore, another object of the present invention is to provide an organic electronic element and an organic EL element which include a layer with charge transporting performance better than ever before.

Solution to Problem

The inventors have, as a result of earnest studies, found that a material according to the present invention, which is obtained by combining an ionic compound that has a specific structure with a compound including a charge transporting unit, can solve some of the problems mentioned above, thereby completing the present invention More specifically, the present invention is characterized by the following aspects <1> to <11>.

<1> An organic electronic material comprising at least an ionic compound represented by the following general formula (1), and a compound including a charge transporting unit (hereinafter, referred to as a charge transporting compound).

[Chemical Formula 1]

General Formula (1)

[In the general formula (1), $R^a$ to $R^c$ each independently represent a hydrogen atom (H), an alkyl group, or a benzyl group, and N is not bonded to an aryl group. A represents an anion.]

<2> The organic electronic material according to <1>, wherein the anion is represented by the following formulas (1b) to (5b).

[Chemical Formula 2]

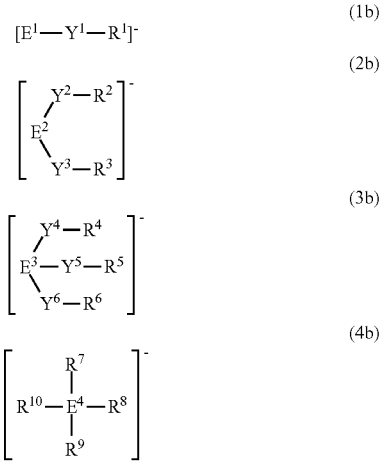

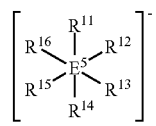

[In the general formulas (1b) to (5b), $Y^1$ to $Y^6$ each independently represent a divalent linking group, and $R^1$ to $R^{16}$ each independently represent an electron attractive organic substituent (these structures may further have substituents and hetero atoms therein, and $R^2$ and $R^3$, $R^4$ to $R^6$, $R^7$ to $R^{10}$, or $R^{11}$ to $R^{16}$ may be each linked to form a ring or a polymer). $E^1$, $E^2$, $E^3$, $E^4$, and $E^5$ respectively represent an oxygen atom, a nitrogen atom, a carbon atom, a boron atom or a gallium atom, and a phosphorus atom or an antimony atom.]

<3> The organic electronic material according to <1> or <2>, wherein the charge transporting unit is an aromatic amine, a carbazole, or a thiophene.

<4> The organic electronic material according to any of <1> to <3>, wherein the charge transporting compound is a polymer or an oligomer.

<5> The organic electronic material according to any of <1> to <4>, wherein the charge transporting compound includes one or more polymerizable substituents.

<6> The organic electronic material according to <5>, wherein the polymerizable substituents are any of an oxetane group, an epoxy group, and a vinyl ether group.

<7> An ink composition comprising the organic electronic material according to any of <1> to <6> and a solvent.

<8> An organic electronic element including a layer formed by an application method with the use of the organic electronic material according to any one of <1> to <6> or the ink composition according to <7>.

<9> The organic electronic element according to <8>, wherein the layer formed by the application method is polymerized for insolubilization.

<10> The organic electronic element according to <9>, wherein another layer is further formed on the insolubilized layer to provide a multi-layer.

<11> The organic electronic element according to any of <8> to <10>, wherein the substrate is a resin film.

Advantageous Effects of Invention

The present invention can provide an organic electronic material which is high in thermal stability, excellent in storage stability in the case as an ink composition, and able to prepare, at a high yield, an organic electronic element capable of reducing the driving voltage and of being driven stably for a long period of time, and an ink composition including the organic electronic material.

Further, the present invention can provide an organic electronic element and an organic EL element which include a layer with charge transporting performance better than ever before.

BRIEF DESCRIPTION OF DRAWINGS

FIG. 1 is a schematic diagram illustrating an example of a multi-layered organic EL element.

DESCRIPTION OF EMBODIMENTS

<Organic Electronic Material>

An organic electronic material according to the present invention is characterized in that it contains at least an ionic compound represented by the following general formula (1), and a compound including a charge transporting unit (hereinafter, referred to as a charge transporting compound).

[Chemical Formula 3]

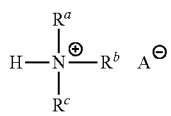

General Formula (1)

[In the general formula (1), $R^a$ to $R^c$ each independently represent a hydrogen atom (H), an alkyl group, or a benzyl group, and N is not bonded to an aryl group. A represents an anion.]

In the present invention, the ionic compound represented by the general formula (1) is characterized in that at least one of the four substituents N is a hydrogen atom, and none of the substituents is linked to an aryl group. More specifically, N in the general formula (1) is linked to a hydrogen atom (H), an alkyl group, or a benzyl group, but not linked to an aryl group, and such a composition improves stability against heat and light, and thus improves the stability of an ink composition which contains the compound including the charge transporting unit and a solvent. Moreover, the ionic compound can be used as a polymerization initiator, and a stacked element obtained through the use of an application method can be prepared by the combination with a compound including a polymerizable substituent. In addition, a film formed with the use of an ink composition including the ionic compound is high in charge transporting capacity, and useful in organic electronic applications.

In the general formula (1), $R^a$ to $R^c$ may be the same, or different. $R^a$ to $R^c$ may be linked to form a ring.

The alkyl group in the general formula (1) may be straight, branched, or cyclic, may have substituents, and typically has approximately 1 to 20 carbon atoms, and specific examples of the alkyl group include a methyl group, an ethyl group, a propyl group, an i-propyl group, a butyl group, an i-butyl group, a t-butyl group, a pentyl group, a hexyl group, a cyclohexyl group, a heptyl group, an octyl group, a 2-ethylhexyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a 3,7-dimethyloctyl group, a lauryl group, a trifluoromethyl group, a pentafluoroethyl group, a perfluorobutyl group, a perfluorohexyl group, and a perfluorooctyl group.

In order to increase the solubility as an ink composition in a solvent, at least one of $R^a$ to $R^c$ is desirably an alkyl group or a benzyl group, at least two of $R^a$ to $R^c$ are more desirably an alkyl group or a benzyl group, and all of $R^a$ to $R^c$ are desirably an alkyl group or a benzyl group.

In order to improve the thermal stability, all of $R^a$ to $R^c$ are preferably an alkyl group. In order to improve curability at low temperatures as an initiator, at least one of $R^a$ to $R^c$ is desirably a benzyl group.

In the case of dissolving the compound in an alkane or an aromatic solvent, the total number of carbon atoms of $R^a$ to $R^c$ is preferably 6 or more, further preferably 9 or more, and most preferably 12 or more, from the perspective of improving the solubility.

In the general formula (1), while A is not particularly limited as long as it is a conventionally known anion, anions represented by the following general formulas (1b) to (5b) are preferred in manufacturing organic electronic elements, in particular, organic EL elements which are able to be reduced in driving voltage and stably driven for a long period of time.

[Chemical Formula 4]

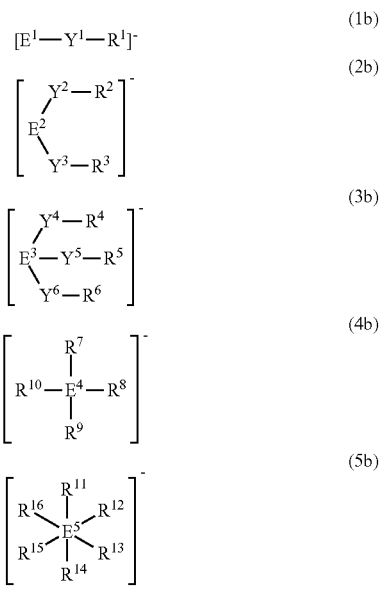

[In the general formulas (1b) to (5b), $Y^1$ to $Y^6$ each independently represent a divalent linking group, and $R^1$ to $R^{16}$ each independently represent an electron attractive organic substituent (these structures may further have substituents and hetero atoms therein, and $R^2$ and $R^3$, $R^4$ to $R^6$, $R^7$ to $R^{10}$, or $R^{11}$ to $R^{16}$ may be each linked to form a ring or a polymer). $E^1$, $E^2$, $E^3$, $E^4$, and $E^5$ respectively represent an oxygen atom, a nitrogen atom, a carbon atom, a boron atom or a gallium atom, and a phosphorus atom or an antimony atom.]

Examples of the electron attractive organic substituents ($R^1$ to $R^{16}$ in the formulas) include: halogen atoms such as a fluorine atom, a chlorine atom, and a bromine atom; alkylsulfonyl groups such as a cyano group, a thiocyano group, a nitro group, and a mesyl group; arylsulfonyl groups such as a tosyl group; acyl groups typically having 1 to 12, preferably to 6 carbon atoms, such as a formyl group, an acetyl group, and a benzoyl group; alkoxycarbonyl groups typically having 2 to 10, preferably to 7 carbon atoms, such as a methoxycarbonyl group and an ethoxycarbonyl group; aryloxycarbonyl groups including an aromatic hydrocarbon group or an aromatic heterocyclic group typically having 3, preferably 4, to 25, preferably to 15 carbon atoms, such as a phenoxycarbonyl group and a pyridyloxycarbonyl group; acyloxy groups typically having 2 to 20 carbon atoms, such as an acetoxy group; haloalkyl, haloalkenyl, and haloalkynyl groups obtained by substituting, with a halogen atom such as a fluorine atom and a chlorine atom, straight, branched, or cyclic alkyl, alkenyl, and alkynyl groups typically having 1 to 10, preferably to 6 carbon atoms, such as an alkyloxysulfonyl group, an aryloxysulfonyl group, a trifluoromethyl group, and a pentafluoroethyl group; and haloaryl groups typically having 6 to 20 carbon atoms, such as a pentafluorophenyl group. Among these groups, from the perspective of being able to efficiently delocalize negative charges, more preferred are groups obtained by substituting, with halogen atoms such as fluorine, some or all of hydrogen atoms of the groups having hydrogen atoms among the organic groups mentioned above, for example, but not limited to, straight, branched, or cyclic perfluoroalkyl groups, perfluoroalkylsulfonyl groups, perfluoroaryl groups, perfluoroalkyloxysulfonyl groups, perfluoroarylsulfonyl groups, perfluoroaryloxysulfonyl groups, perfluoroacyl groups, perfluoroalkoxycarbonyl groups, perfluoroacyloxy groups, perfluoroaryloxycarbonyl groups, perfluoroalkenyl groups, and perfluoroalkynyl groups having 1 to 20 carbon atoms, which may include hetero atoms, as represented by the following group of structural formulas (1). Further, among these groups, preferred are straight and branched perfluoroalkyl groups having 1 to 8 carbon atoms, cyclic perfluoroalkyl groups having 3 to 6 carbon atoms, and perfluoroaryl groups having 6 to 18 carbon atoms.

Group of Structural Formulas (1)

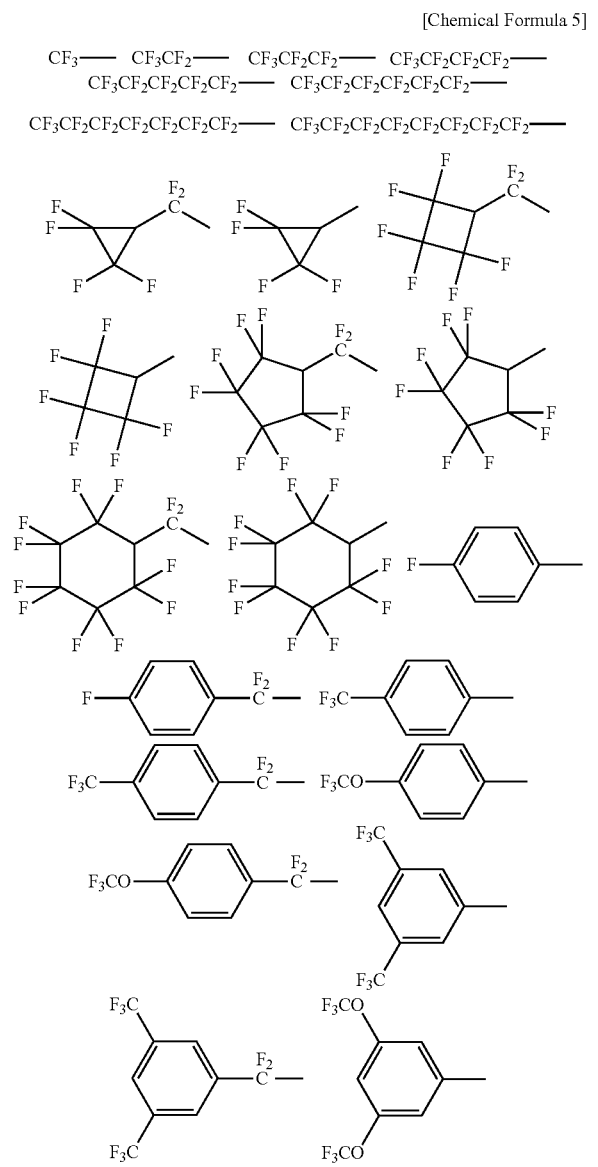

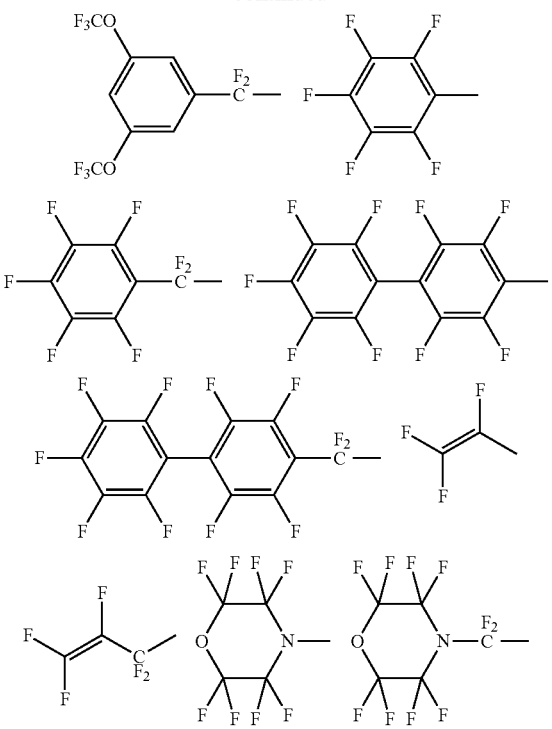

In addition, $Y^1$ to $Y^6$ in the general formulas represent a divalent linking group, specifically, which is preferably any one of the following formulas (1c) to (11c).

[Chemical Formula 6]

 (1c)

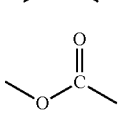 (2c)

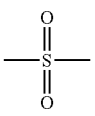 (3c)

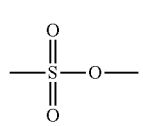 (4c)

—O— (5c)

—S— (6c)

 (7c)

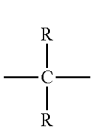 (8c)

-continued

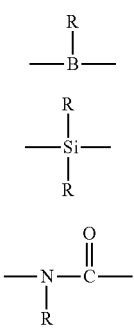

(In the formulas, R represents any organic group (these structures may further have substituents and hetero atoms therein).)

R in the general formulas (7c) to (11c) preferably represents, independently of each other, an alkyl group, an alkenyl group, an alkynyl group, an aromatic hydrocarbon group, or an aromatic heterocyclic group which may be substituted, from the perspective of improvement in electron acceptability and solubility in solvents, and more preferably an organic group having an electron attractive substituent among the previously mentioned substituents, and examples of the organic group include groups in the group of structural formulas (1).

In addition, the anion in the present invention preferably has a negative charge, but not particularly limited to, mainly on an oxygen atom, a nitrogen atom, a carbon atom, a boron atom, or a gallium atom, more preferably on an oxygen atom, a nitrogen atom, a carbon atom, or a boron atom, and most preferably represented by the following formula (12c), (13c), (14c), or (15c).

[Chemical Formula 7]

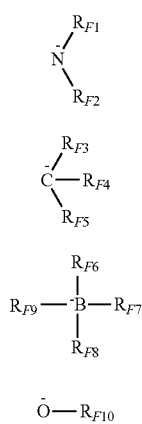

(In the formulas, $R_{F1}$ to $R_{F10}$ each independently represent an electron attractive organic substituent (these structures may further have substituents and hetero atoms therein, and $R_{F1}$ to $R_{F9}$ may be each linked to form a ring or a polymer), and examples of the organic substituent include, but not limited to, the groups represented by the group of structural formulas (1), for example.)

[Charge Transporting Compound]

The "charge transporting compound" in the present invention will be described in detail. In the present invention, the charge transporting compound refers to a compound including a charge transporting unit. In the present invention, the "charge transporting unit" refers to an atom group that has the ability to transport holes or electrons, and will be described below in detail.

The charge transporting unit only has to have the ability to transport holes or electrons, and is preferably, but not particularly limited to, an amine, a carbazole, or a thiophene having an aromatic ring. Specific examples thereof include those described in WO 2011/132702 A. Among these examples, in particular, the following amine structures (1) to (14) are preferred. While the meanings of E, Ar, and X in the following amine structures (1) to (14) are described in detail in the publication mentioned above, here are brief descriptions thereof.

E each independently represents $-R^1$, $-OR^2$, $-SR^3$, $-OCOR^4$, $-COOR^5$, or $-SiR^6R^7R^8$ (provided that $R^1$ to $R^8$ represent a hydrogen atom, a straight, cyclic, or branched alkyl group having 1 to 22 carbon atoms, or an aryl group or a heteroaryl group having 2 to 30 carbon atoms), and Ar each independently represents an arylene group or a heteroarylene group having 2 to 30 carbon atoms. The arylene group and heteroaryl group may have substituents. X and Z each independently a divalent linking group, which is preferably, but not limited to, a group obtained by further removing one hydrogen atom from the group having one or more hydrogen atoms among the previously mentioned groups R. x represents an integer of 0 to 2. Y represents a trivalent linking group, which represents a group obtained by removing two hydrogen atoms from the group having two or more hydrogen atoms among the previously mentioned R.

[Chemical Formula 8]

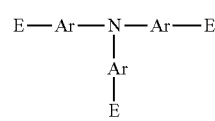

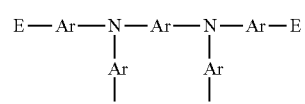

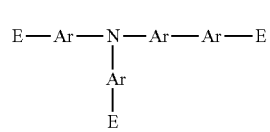

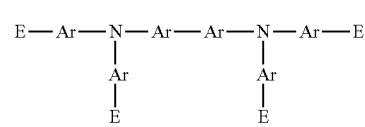

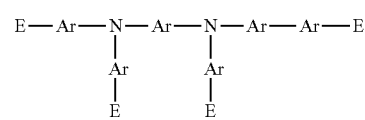

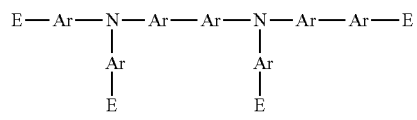

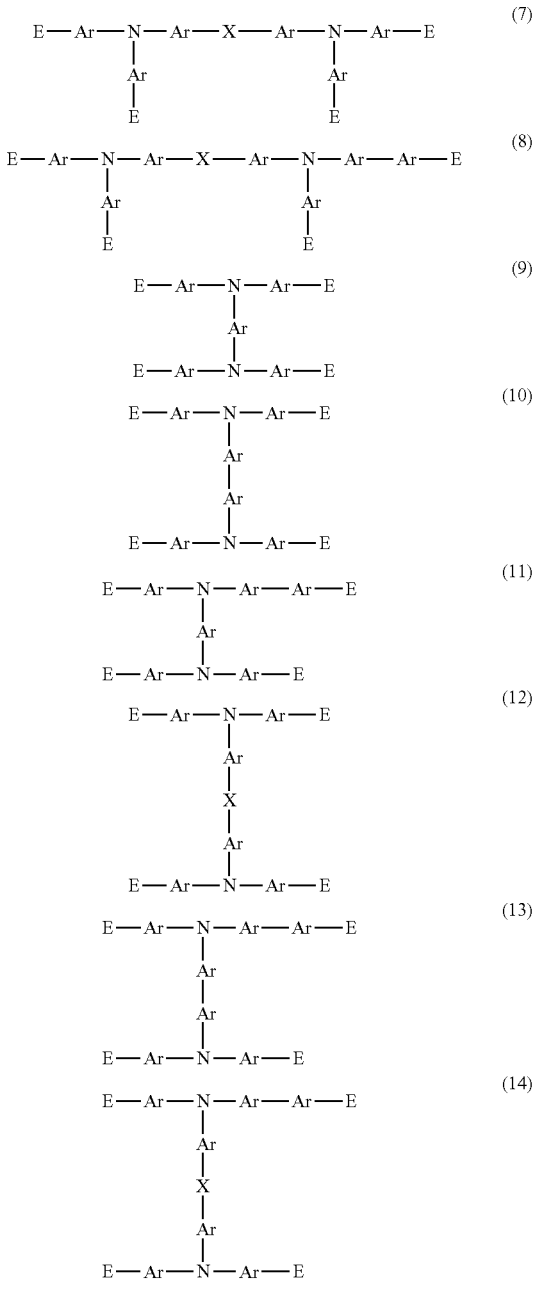

In addition, the charge transporting compound in the present invention is not particularly limited, which may be commercially available compounds, or synthesized by methods known to one skilled in the art.

In addition, the charge transporting compound in the present invention may be a low molecular weight compound, or may be a high molecular weight compound such as a polymer or an oligomer. The high molecular weight compound such as a polymer or an oligomer is preferred from the perspective of solubility in organic solvents, whereas the low molecular weight compound is preferred from the perspective of easy purification by sublimation or recrystallization.

When the charge transporting compound in the present invention is a polymer or an oligomer, a polymer or an oligomer that has a structure branched in three or more directions is preferred from the perspective of lowering the temperature for progressing an adequate polymerization reaction. In addition, this branched structure can increase the glass transition temperature of the polymer or oligomer, and thus also makes a contribution to an improvement in the heat resistance of the polymer or oligomer.

This branched structure means that when a chain with the highest degree of polymerization is regarded as a main chain among various chains in a molecule of the polymer or oligomer, a side chain with the same degree of polymerization or a lower degree of polymerization is linked to the main chain. The degree of polymerization in the present invention refers to the number of monomer units for use in synthesizing the polymer or oligomer, which are contained per molecule of the polymer or oligomer. The side chain in the present invention refers to a chain including at least one or more polymerization units, which is different from the main chain of the polymer or oligomer, and the other chains are regarded as not side chains but substituents.

The method for forming the branched structure is not particularly limited, but the polymer or oligomer may be formed with the use of a monomer that has three or more polymerizable sites in a molecule, or formed by forming linear polymers or oligomers, followed by the polymerization of the polymers or oligomers with each other.

Specifically, any one of structures of the following general formulas (1) to (10) is preferably included as an origin unit for forming the branched structure in the polymer or oligomer.

[Chemical Formula 9]

-continued

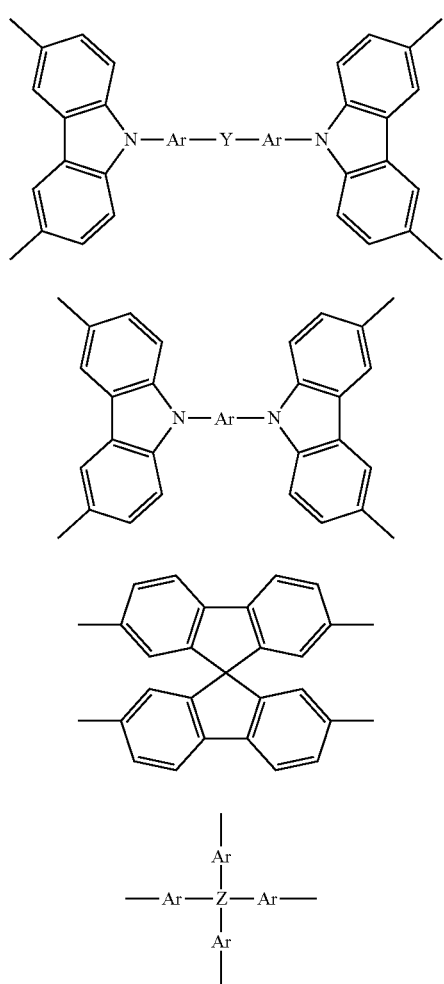

(In the formulas, Ar each independently represents a divalent linking group, and represents an arylene group or a heteroarylene group having 2 to 30 carbon atoms. The arylene group is an atom group of an aromatic hydrocarbon with two hydrogen atoms removed therefrom, which may have substituents, and examples thereof include, for example, phenylene, biphenyl-diyl, terphenyl-diyl, naphthalene-diyl, anthracene-diyl, tetracene-diyl, fluorene-diyl, and phenanthrene-diyl. The heteroarylene group is an atom group of an aromatic compound having a hetero atom with two hydrogen atoms removed therefrom, which may have substituents, and examples thereof include, for example, pyridine-diyl, pyrazine-diyl, quinoline-diyl, isoquinoline-diyl, acridine-diyl, phenanthroline-diyl, furan-diyl, pyrrole-diyl, thiophene-diyl, oxazole-diyl, oxadiazole-diyl, thiadiazole-diyl, triazole-diyl, benzoxazole-diyl, benzoxadiazole-diyl, benzothiadiazole-diyl, benzotriazole-diyl, and benzothiophene-diyl. W represents a trivalent linking group, which is an atom group of the arylene group or heteroarylene group with one hydrogen atom further removed therefrom, which may have substituents. Y each independently represents a divalent linking group. Z represents any of a carbon atom, a silicon atom, and a phosphorus atom.)

Y in the general formulas (4) and (7) is preferably a divalent linking group represented by the following formulas.

[Chemical Formula 10]

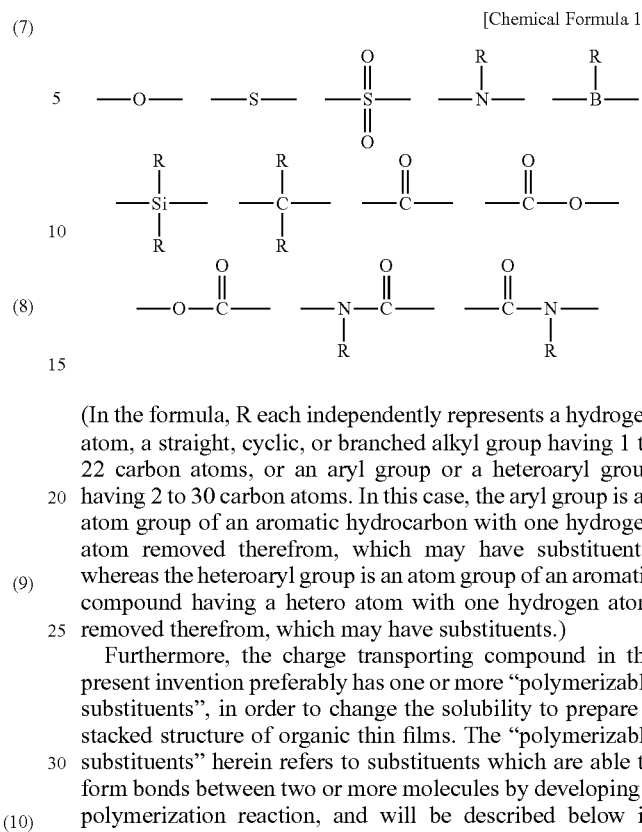

(In the formula, R each independently represents a hydrogen atom, a straight, cyclic, or branched alkyl group having 1 to 22 carbon atoms, or an aryl group or a heteroaryl group having 2 to 30 carbon atoms. In this case, the aryl group is an atom group of an aromatic hydrocarbon with one hydrogen atom removed therefrom, which may have substituents, whereas the heteroaryl group is an atom group of an aromatic compound having a hetero atom with one hydrogen atom removed therefrom, which may have substituents.)

Furthermore, the charge transporting compound in the present invention preferably has one or more "polymerizable substituents", in order to change the solubility to prepare a stacked structure of organic thin films. The "polymerizable substituents" herein refers to substituents which are able to form bonds between two or more molecules by developing a polymerization reaction, and will be described below in detail.

Examples of the polymerizable substituents include groups having a carbon-carbon multiple bond (examples thereof can include, for example, a vinyl group, an acetylene group, a butenyl group, an acrylic group, an acrylate group, an acrylamide group, a methacrylic group, a methacrylate group, a methacrylamide group, an arene group, an allyl group, a vinyl ether group, a vinyl amino group, a furyl group, a pyrrole group, a thiophene group, and a silole group), groups having a small ring (for example, a cyclopropyl group, a cyclobutyl group, an epoxy group, an oxetane group, a diketene group, an episulfide group), and groups containing a lactone group, a lactam group, or a siloxane derivative. Further, in addition to the groups mentioned above, groups which are able to form an ester linkage or an amide linkage can be also used in combination. The combinations include, for example, combinations such as an ester group and an amino group, and an ester group and a hydroxyl group. As the polymerizable substituents, in particular, an oxetane group, an epoxy group, a vinyl group, a vinylether group, an acrylate group, and a methacrylate group are preferred from the perspective of reactivity, and an oxetane group is most preferred. From the perspective of increasing the degree of freedom of the polymerizable substituents to make a curing reaction likely to be developed, the main chain of the polymer or oligomer and the polymerizable substituents are more preferably linked through an alkyl chain having 1 to 8 carbon atoms.

In addition, the polymer or oligomer in the present invention may be copolymers having, as copolymerization repeating units, structures represented by the following group of structural formulas (X) as the arylene group or heteroarylene group, in addition to repeating units represented by the general formulas (1a) to (84a) described in WO 2011/132702 A mentioned previously, in order to adjust the solubility, heat resistance, or electrical properties. In this case, the copolymer may be a random, block, or graft copolymer, or may be a polymer which has an intermediate structure between the copolymers, for example, a block-like random copolymer. In addition, the polymer or oligomer for use in the present invention may be branched in the main chain, with three or more terminals. It is to be noted that R in the group of structural formulas (X) each independently represents a hydrogen atom, a straight, cyclic, or branched alkyl group having 1 to 22 carbon atoms, or an aryl group or a heteroaryl group having 2 to 30 carbon atoms.

[Group of Structural Formulas (X)]

[Chemical Formula 11]

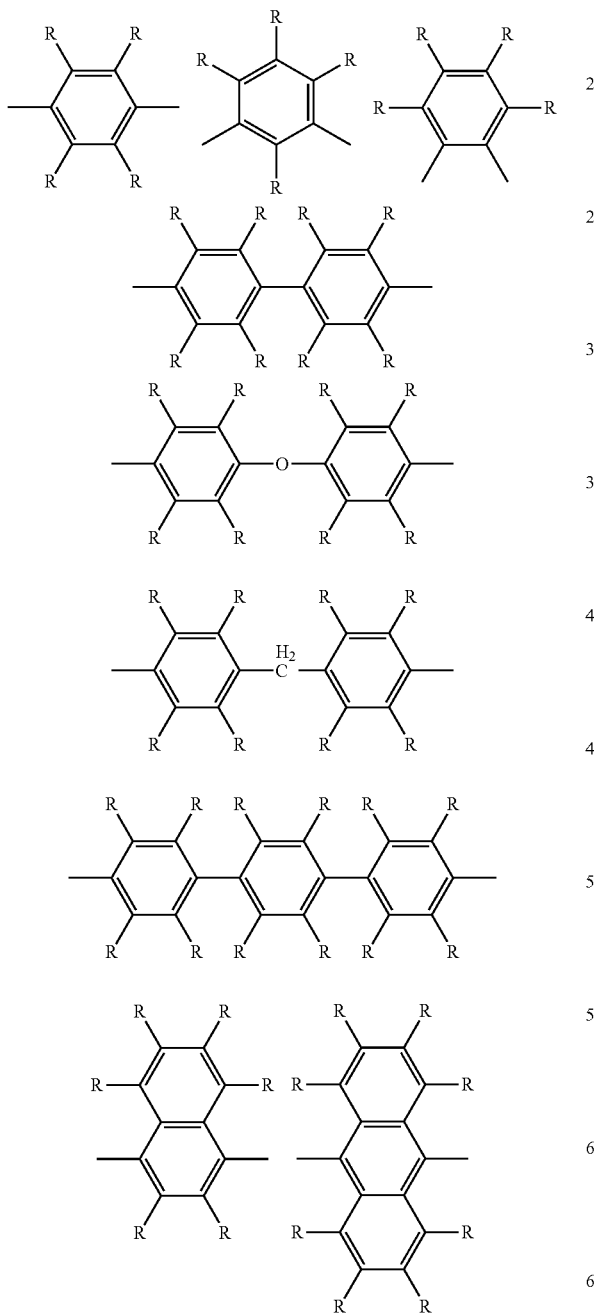
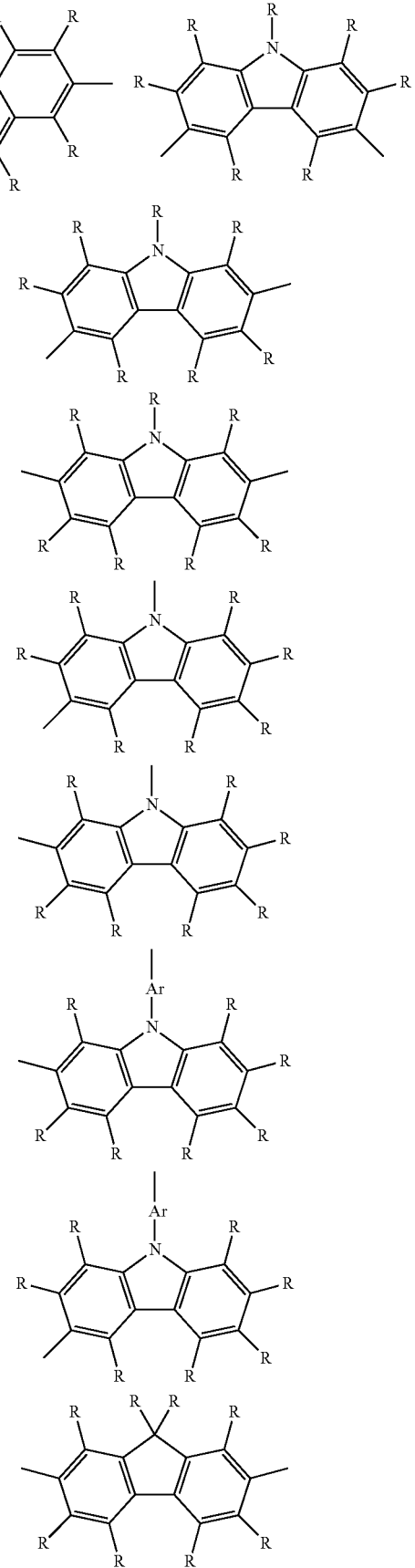

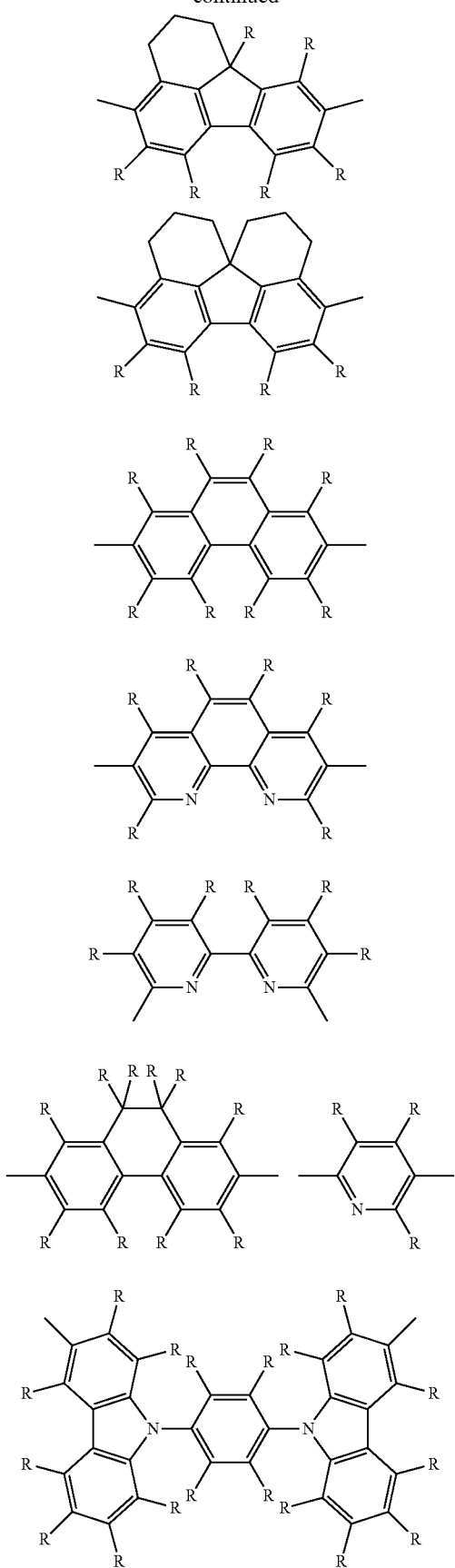

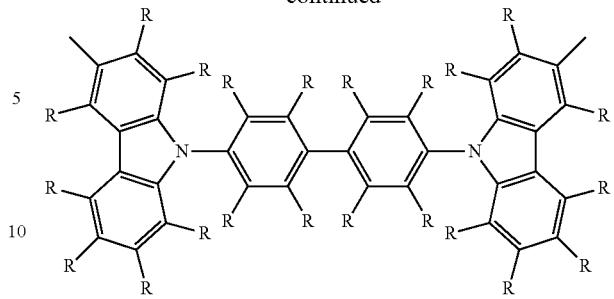

In addition, when the charge transporting compound is a polymer or an oligomer, the number average molecular weight is preferably 1,000 or more and 1,000,000 or less from the perspective of solubility in solvents and film formation property. The number average molecular weight is more preferably 2,000 or more and 900,000 or less, further preferably 3,000 or more and 800,000 or less. The number average molecular weight less than 1,000 makes the compound likely to be crystallized, thereby resulting in deterioration of film formation property. In addition, the molecular weight more than 1,000,000 decreases the solubility in solvents, thereby making it difficult to prepare an applied solution or an applied ink.

In addition, the organic electronic material according to the present invention preferably includes a polymerization initiator, in order to utilize the difference in solubility caused by a polymerization reaction.

The polymerization initiator is not particularly limited as long as the initiator shows the ability to polymerize the polymerizable substituents by applying heat, light, microwaves, radiation, electron beams, or the like but preferably a polymerization initiator which initiates polymerization by light irradiation and/or heating.

In addition, the ionic compound according to the present invention can be used alone as a polymerization initiator.

In order to form various types of layers for use in organic electronic elements and the like with the use of the organic electronic material according to the present invention, for example, a solution (ink composition) containing the organic electronic material according to the present invention can be applied onto a desired base body by a known method such as, for example, an ink-jet method, a casting method, a dipping method, printing methods, e.g., relief printing, intaglio printing, offset printing, planographic printing, relief reverse offset printing, screen printing, and gravure printing, a spin coating method, and then subjected to light irradiation, heat treatment, or the like to progress a polymerization reaction of the polymer or oligomer, and change the solubility of the applied layer (curing). The repetition of such work makes it possible to increase the number of layers for high-molecular type organic electronic elements and organic EL elements.

The application method as described above can be typically implemented in the temperature range of −20 to +300° C., preferably 10 to 100° C., particularly preferably 15 to 50° C., and examples of the solvent for use in the solution described above include, but not particularly limited to, for example, solvents for use in the preparation of an ink composition as will be described later.

In addition, for the light irradiation mentioned above, light sources can be used such as low-pressure mercury vapor lamps, medium-pressure mercury vapor lamps, high-pressure mercury vapor lamps, ultrahigh-pressure mercury vapor lamps, metal halide lamps, xenon lamps, fluorescent lights, light emitting diodes, and sunlight.

In addition, the heat treatment can be carried out on a hot plate or in an oven, and carried out in the temperature range of 0 to +300° C., preferably 50 to 250° C., particularly preferably 80 to 200° C.

<Ink Composition>

An ink composition according to the present invention is characterized in that it contains the already described organic electronic material according to the present invention, and a solvent, and may contain other additives, for example, a polymerization inhibitor, a stabilizer, a thickener, a gelator, a flame retardant, an antioxidant, an antireductant, an oxidant, a reductant, a surface modifier, an emulsifier, an antifoamer, a dispersant, and a surfactant. Examples of the solvent include: water; alcohols such as methanol, ethanol, and isopropyl alcohol; alkanes such as pentane, hexane, and octane; cyclic alkanes such as cyclohexane; aromatic solvents such as benzene, toluene, xylene, mesitylene, tetralin, and diphenylmethane; aliphatic ethers such as ethylene glycol dimethyl ether, ethylene glycol diethyl ether, and propylene glycol-1-monomethyl ether acetate; aromatic ethers such as 1,2-dimethoxybenzene, 1,3-dimethoxybenzene, anisole, phenetole, 2-methoxytoluene, 3-methoxytoluene, 4-methoxytoluene, 2,3-dimethylanisole, and 2,4-dimethylanisole; aliphatic esters such as ethyl acetate, n-butyl acetate, ethyl lactate, and n-butyl lactate; aromatic esters such as phenyl acetate, phenyl propionate, methyl benzoate, ethyl benzoate, propyl benzoate, and n-butyl benzoate; amide solvents such as N,N-dimethylformamide and N,N-dimethylacetoamide; and other solvents such as dimethyl sulfoxide, tetrahydrofuran, acetone, chloroform, and methylene chloride, and preferably, aromatic solvents, aliphatic esters, aromatic esters, aliphatic ethers, and aromatic ethers can be used.

In the ink composition according to the present invention, the content of the organic electronic material with respect to the solvent is preferably 0.1 to 30 mass % from the perspective of being applicable to various application processes.

<Organic Electronic Element, Organic Electroluminescent Element>

An organic electronic element according to the present invention includes a layer formed by an application method with the use of the organic electronic material or ink composition mentioned above, and further an insolubilized layer obtained by polymerizing the formed layer.

Likewise, an organic electroluminescent element (organic EL element) according to the present invention includes a layer formed with the use of the organic electronic material or ink composition mentioned above, and further an insolubilized layer obtained by polymerizing the formed layer.

The elements each include the excellent layer formed with the use of the organic electronic material according to the present invention, and has a lower driving voltage and a longer emission lifetime than ever before.

An EL element according to the present invention will be described below in detail.

[Organic EL Element]

The organic EL element according to the present invention is not particularly limited as long as the element includes a light emitting layer, a polymerized layer, an anode, a cathode, and a substrate, but may have other layers such as a hole injecting layer, an electron injecting layer, a hole transporting layer, and an electron transporting layer. Further, the hole injecting layer, hole transporting layer, or light emitting layer is preferably a layer formed with the use of the organic electronic material or ink composition according to the present invention.

The respective layers will be described below in detail.
(Light Emitting Layer)

The material for use in the light emitting layer may be a low molecular weight compound or may be a polymer or an oligomer, and it is also possible to use dendrimers and the like. Low molecular weight compounds which use fluorescence emissions include perylene, coumarin, rubrene, quinacridone, dyes for dye laser (for example, rhodamine, DCM1, etc.), aluminum complexes (for example, Tris(8-hydroxyquinolinato)aluminum (III) ($Alq_3$)), stilbene, and derivatives thereof. Polyfluorene, polyphenylene, polyphenylenevinylene (PPV), polyvinylcarbazole (PVK), a fluorene-benzothiadiazole copolymer, a fluorene-triphenylamine copolymer, and derivatives and mixtures thereof can be used in a preferred manner as polymers or oligomers which use fluorescence emissions.

On the other hand, in recent years, phosphorescent organic EL elements have been also actively developed in order to achieve higher-efficiency organic EL elements. Phosphorescent organic EL elements are able to use not only energy in singlet states, but also energy in triplet states, and increase the internal quantum yields up to 100% in principle. In the case of phosphorescent organic EL elements, a host material is doped with a phosphorescent material of metal complex including a heavy metal such as platinum or iridium as a dopant that produces phosphorescence to extract phosphorescent emissions (see M. A. Baldo et al., Nature, vol. 395, p. 151 (1998), M. A. Baldo et al., Applied Physics Letters, vol. 75, p. 4 (1999), M. A. Baldo et al., Nature, vol. 403, p. 750 (2000)).

Also in the case of the organic EL element according to the present invention, it is preferable to use a phosphorescent material for the light emitting layer, from the perspective of higher efficiency. As the phosphorescent material, metal complexes and the like including a central metal such as Ir or Pt can be used in a preferred manner. Specifically, Ir complexes include, for example, FIr(pic)[iridium (III) bis[(4,6-difluorophenyl)-pyridinato-N,$C^2$]picolinate] which emits blue light, $Ir(ppy)_3$[fac tris(2-phenylpyridine)iridium] (see M. A. Baldo et al., Nature, vol. 403, p. 750 (2000) mentioned previously) which emits green light, or $(btp)_2Ir(acac)${bis[2-(2'-benzo[4,5-α]thienyl)pyridinato-N,C3]iridium(acetyl-acetonate)} and $Ir(piq)_3$[tris(1-phenylisoquinoline)iridium] which emit red light, as mentioned in Adachi et al., Appl. Phys. Lett., 78 No. 11, 2001, 1622.

Pt complexes include, for example, 2,3,7,8,12,13,17,18-octaethyl-21H,23H-porphyrinplatinum (PtOEP) which emits red light.

Low molecular or dendrite types, for example, iridium cored dendrimers can be used for the phosphorescent material. Furthermore, derivatives of these materials can be also used in a preferred manner.

In addition, when a phosphorescent material is included in the light emitting layer, the layer preferably includes a host material in addition to the phosphorescent material.

The host material may be a low molecular weight compound or a high molecular weight compound, and dendrimers and the like can be also used as the host material.

For example, CBP (4,4'-Bis(Carbazol-9-yl)-biphenyl), mCP (1,3-bis(9-carbazolyl)benzene), and CDBP (4,4'-Bis(Carbazol-9-yl)-2,2'-dimethylbiphenyl) can be used as the low molecular weight compound, whereas, for example, polyvinylcarbazole, polyphenylene, and polyfluorene can be used as the high molecular weight compound, and derivatives thereof can be also used.

The light emitting layer may be formed by a vapor deposition method, or may be formed by an application method.

In the case of the formation by an application method, the organic EL element can be inexpensively manufactured, which is more preferred. In order to form the light emitting layer by an application method, a solution containing the phosphorescent material, and if necessary, a host material can be applied onto a desired base body by a known method such as, for example, an ink-jet method, a casting method, a dipping method, printing methods, e.g., relief printing, intaglio printing, offset printing, planographic printing, relief reverse offset printing, screen printing, and gravure printing, a spin coating method.

(Cathode)

The cathode material is preferably, for example, a metal or a metal alloy such as Li, Ca, Mg, Al, In, Cs, Ba, Mg/Ag, LiF, or CsF.

(Anode)

Metals (for example, Au) or other materials with metallic conductivity, for example, oxides (for example, ITO:indium oxide/tin oxide) and conductive polymers (for example, a mixture of polythiophene-polystyrene sulfonate (PEDOT: PSS)), also can be used as the anode.

(Electron Transporting Layer, Electron Injecting Layer)

Examples of the electron transporting layer and electron injecting layer include, for example, phenanthroline derivatives (for example, 2,9-dimethyl-4,7-diphenyl-1,10-phenanthroline (BCP)), bipyridine derivatives, nitro-substituted fluorene derivatives, diphenylquinone derivatives, thiopyrandioxide derivatives, heterocyclic tetracarboxylic anhydrides such as naphthaleneperylene, carbodiimide, fluorenylidene methane derivatives, anthraquinonedimethane and anthrone derivatives, oxadiazole derivatives (2-(4-Biphenylyl)-5-(4-tert-butylphenyl-1,3,4-oxadiazole) (PBD)), and aluminum complexes (for example, Tris(8-hydroxyquinolinato)aluminum (III) ($Alq_3$)). Furthermore, in association with the oxadiazole derivatives mentioned above, thiadiazole derivatives with a sulfur atom substituted for an oxygen atom of an oxadiazole ring and quinoxaline derivatives having a quinoxaline ring known as an electron attractive group can be also used.

(Substrate)

The substrate which can be used for the organic EL element according to the present invention is not particularly limited on the type such as glass or plastic, or not particularly limited as long as the substrate is transparent, but glass, quartz, light transmissive resin films, etc. are used preferably. In the case of using a resin film (flexible substrate), it is possible to provide the organic EL element with flexibility, which is particularly preferred.

Examples of the resin film include films composed of, for example, polyethylene terephthalate (PET), polyethylene naphthalate (PEN), polyethersulfone (PES), polyetherimide, polyether ether ketone, polyphenylenesulfide, polyarylate, polyimide, polycarbonate (PC), cellulose triacetate (TAC), or cellulose acetate propionate (CAP).

In addition, in the case of using the resin film, in order to suppress permeation of water vapor, oxygen, etc., the resin film may be coated with an inorganic substance such as silicon oxide or silicon nitride and used.

(Luminescent Color)

While the luminescent color is not to be considered particularly limited in the organic EL element according to the present invention, white light emitting elements are preferred because the elements can be used for various types of lighting devices such as domestic lighting, in-car lighting, and backlights for watches and liquid crystals.

As a method for forming a white light emitting element, multiple luminescent materials are used to simultaneously produce and mix multiple luminescent colors for obtaining a white light emission, because it is currently difficult to produce a white light emission with a single material. While the combination of multiple luminescent colors is not to be considered particularly limited, examples thereof include a combination containing three emission maximum wavelengths for blue, green, and red, and a combination containing two emission maximum wavelengths, which uses a complementary relationship such as blue and yellow or as greenish yellow and orange. In addition, the luminescent color can be controlled by adjusting the type and amount of the luminescent materials.

<Display Element, Lighting Device, Display Device>

A display element according to the present invention is characterized in that it includes the already described organic EL element according to the present invention.

For example, a color display element is obtained by the use of the organic EL element according to the present invention as elements corresponding to respective pixels for red, green, and blue (RGB).

Types of image formation includes: a simple matrix type for directly driving individual organic EL elements arranged on a panel with electrodes arranged in a matrix form; and an active matrix type for driving thin film transistors arranged for each element. The former is used to display characters and the like, because the number of vertical pixels is limited although the structure is simple. The latter is used for high-definition display, because bright high-definition images are obtained with a small amount of current at a low driving voltage.

In addition, a lighting device according to the present invention is characterized in that it includes the already described organic EL element according to the present invention. Furthermore, a display device according to the present invention is characterized in that it includes the lighting device and a liquid crystal element as a display means. The display device may be a display device, that is, a liquid crystal display device which uses the lighting device according to the present invention as a backlight (white light emitting light source) and uses a liquid crystal element as a display means. This configuration refers to a known liquid crystal display device in which only a backlight is replaced with the lighting device according to the present invention, and known techniques can be diverted to the liquid crystal element section.

EXAMPLES

The present invention will be further specifically described below with reference to examples, but is not to be considered limited to the following examples.

(Synthesis of Ionic Compound 1)

The addition of 4.25 g of hydrobromic acid (48%) to 4.87 g (24.9 mmol) of N,N-Dicyclohexylmethylamine(I), followed by shaking up, resulted in precipitation of a white crystal. The crystal was left overnight, then with the addition of acetone thereto, filtered, washed with acetone, dried to obtain 5.9 g (reaction yield 86%) of white crystal. Checking by proton NMR confirmed the disappearance of N,N-Dicyclohexylmethylamine (I) and the generation of N,N-Dicyclohexylmethylammonium bomide (II). Then, 1.38 g (5.0 mmol) of (II) mentioned above and 35.2 g (5.0 mmol) of sodium tetrakis(pentaphenyl)borate (10% aq.) were mixed and stirred to separate a white precipitate. The precipitate was left overnight, then filtered, washed with water, and dried to obtain a white solid (yield 4.0 g/reaction yield 90%).

Here is the reaction formula of the reaction mentioned above.

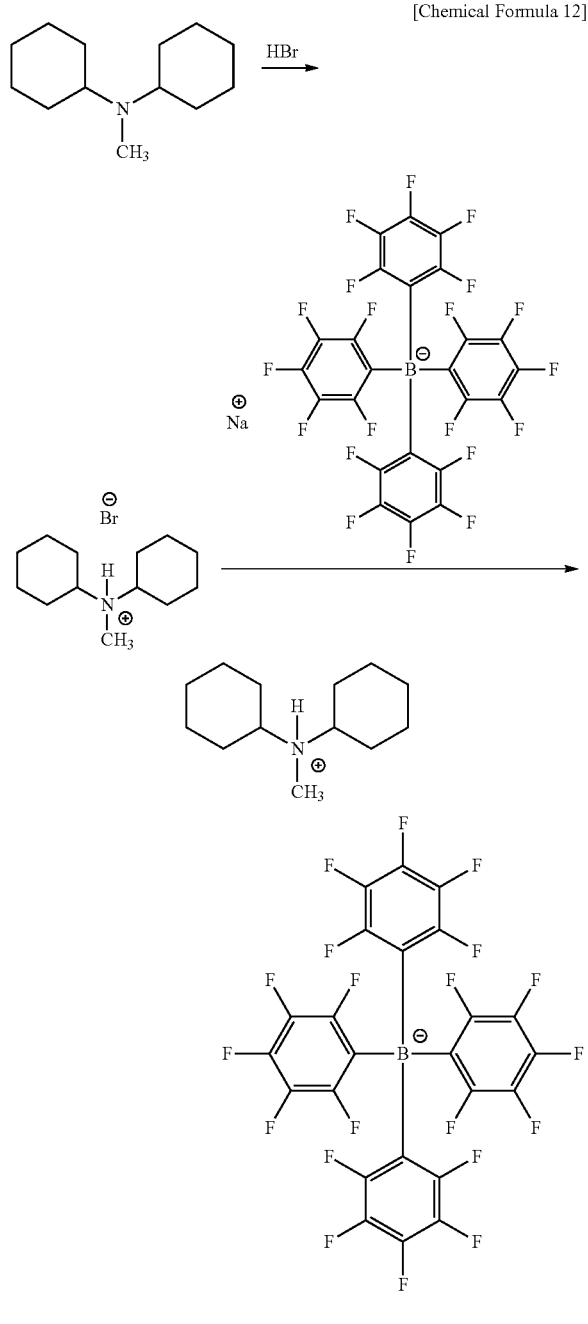

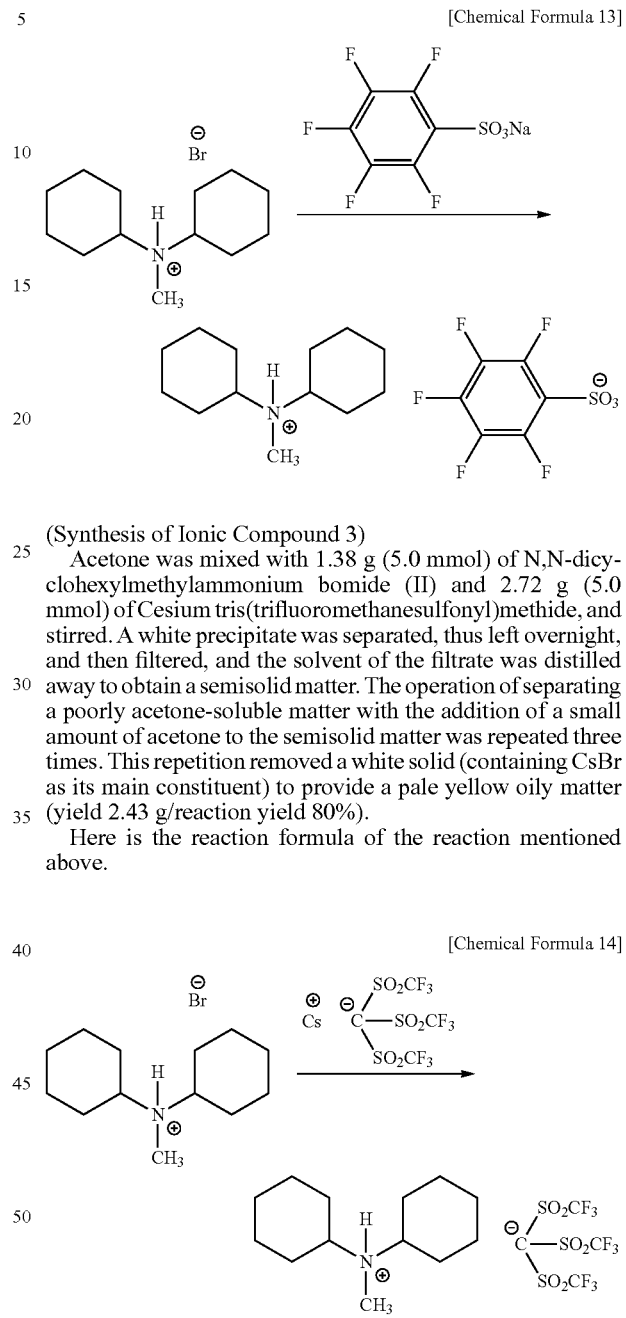

Here is the reaction formula of the reaction mentioned above.

(Synthesis of Ionic Compound 2)

Acetone was mixed with 1.38 g (5.0 mmol) of N,N-dicyclohexylmethylammonium bomide (II) and 1.35 g (5.0 mmol) of sodium pentafluorobenzensulfonate, and stirred. A white precipitate was separated, thus left overnight, and then filtered, and the solvent of the filtrate was distilled away to obtain a semisolid matter. The operation of separating a poorly acetone-soluble matter with the addition of a small amount of acetone to the semisolid matter was repeated three times. This repetition removed a white solid (containing NaBr as its main constituent) to provide a pale yellow oily matter (which was left for crystallization) (yield 1.33 g/reaction yield 60%).

(Synthesis of Ionic Compound 3)

Acetone was mixed with 1.38 g (5.0 mmol) of N,N-dicyclohexylmethylammonium bomide (II) and 2.72 g (5.0 mmol) of Cesium tris(trifluoromethanesulfonyl)methide, and stirred. A white precipitate was separated, thus left overnight, and then filtered, and the solvent of the filtrate was distilled away to obtain a semisolid matter. The operation of separating a poorly acetone-soluble matter with the addition of a small amount of acetone to the semisolid matter was repeated three times. This repetition removed a white solid (containing CsBr as its main constituent) to provide a pale yellow oily matter (yield 2.43 g/reaction yield 80%).

Here is the reaction formula of the reaction mentioned above.

(Synthesis of Ionic Compound 4)

The addition of 3.4 g of hydrobromic acid (48%) to 4.54 g (20.0 mmol) of triamylamine (I), followed by shaking up, provided two separated layers. The layers remained, even after leaving the layers overnight, unchanged as oily matters. Checking the upper-layer oily matter by proton NMR confirmed the disappearance of triamylamine (I) and the generation of Triamylammonium bomide (II). Then, 1.03 g (3.3 mmol) of (II) mentioned above and 23.5 g (3.3 mmol) of sodium tetrakis(pentaphenyl)borate (10% aq.) were mixed and stirred to separate a white precipitate. The precipitate was left overnight, then filtered, washed with water, and dried to obtain a white solid (yield 2.6 g/reaction yield 87%).

[Chemical Formula 15]

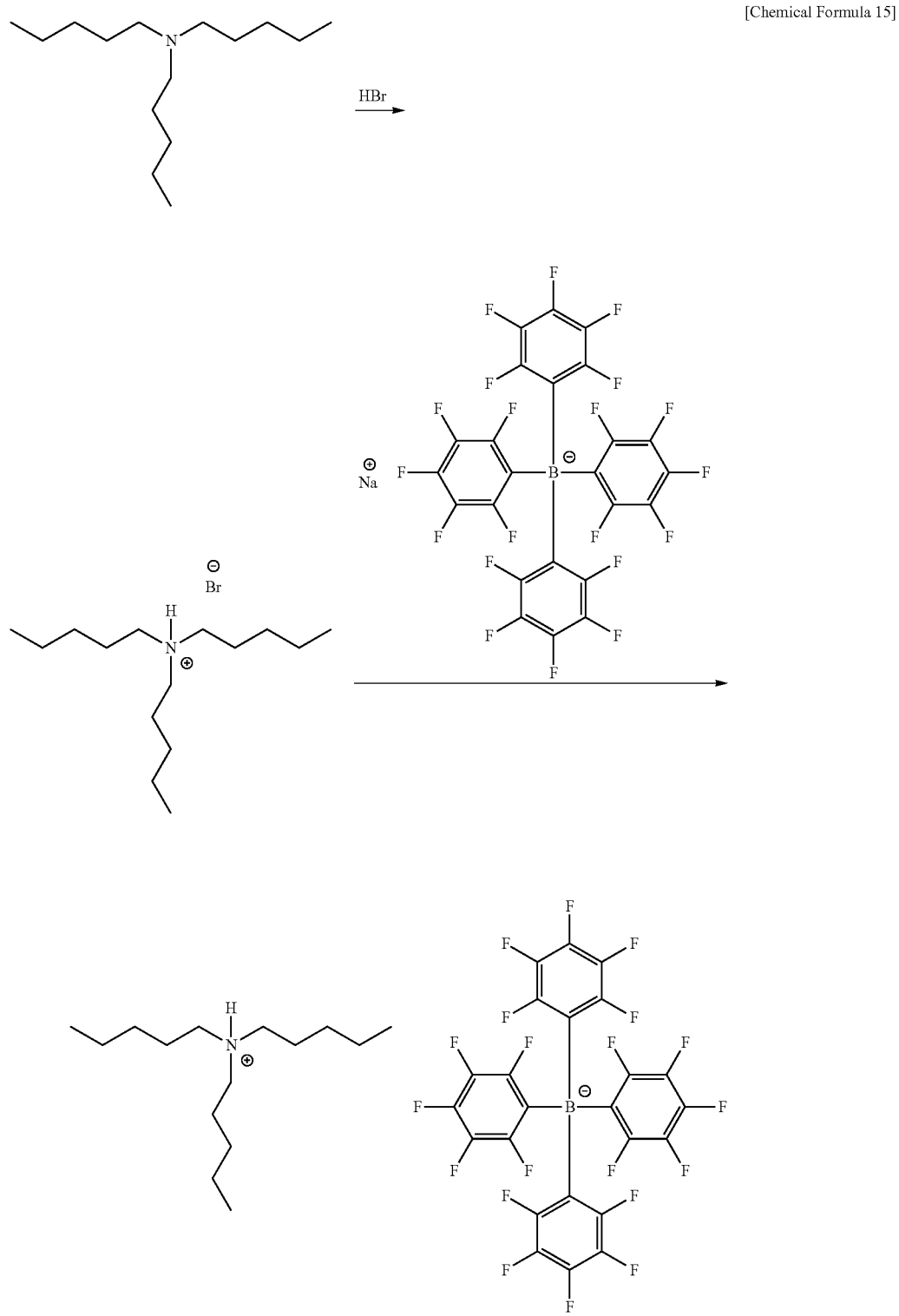

(Synthesis of Ionic Compound 5)

A small amount of acetone solution of 1.17 g (3.3 mmol) of tris(2-ethylhexyl)amine (I) was mixed with 0.56 g of hydrobromic acid (48%), and left for 1 hour, and the acetone was then removed under reduced pressure to obtain a slightly colored oily matter (II). Then, the (II) mentioned above and 23.1 g (3.3 mmol) of sodium tetrakis(pentaphenyl)borate (10% aq.) were mixed, and stirred at room temperature for 3 hours. The oily matter was extracted with ethyl acetate, washed with water, and dried, and the solvent was distilled away under reduced pressure to obtain oily matter tinged with pale pink (yield 3.3 g/reaction yield 97%).

[Chemical Formula 16]

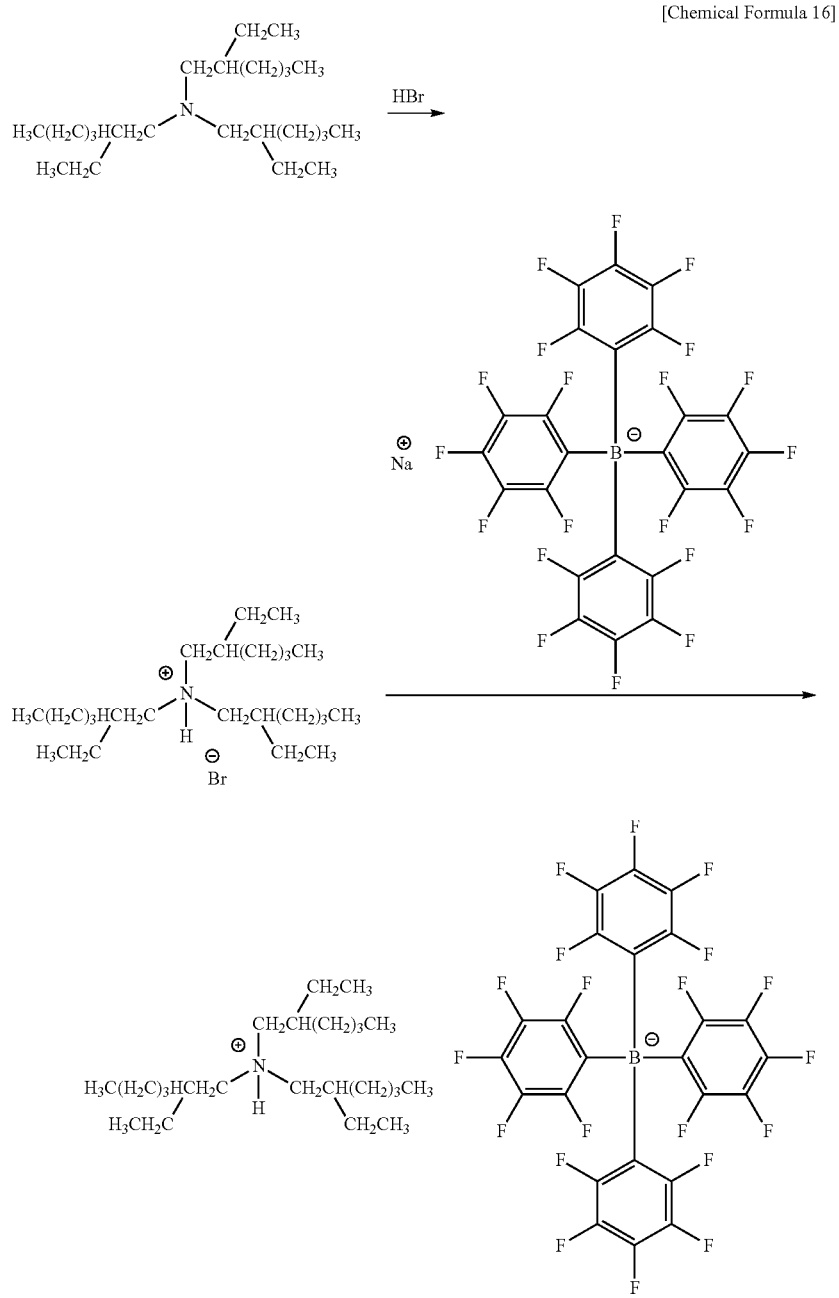

(Synthesis of Ionic Compound 6)

A small amount of acetone solution of 0.43 g (3.3 mmol) of dibutylamine (I) was mixed with 0.56 g of hydrobromic acid (48%), and left for 1 hour, and the acetone was then removed under reduced pressure to obtain an almost white solid (II). Then, the (II) mentioned above and 23.1 g (3.3 mmol) of sodium tetrakis(pentaphenyl)borate (10% aq.) were mixed, and stirred at room temperature for 3 hours. A precipitate produced was thus filtered under reduced pressure, washed with water, and dried to obtain a solid slightly tinged with pale yellow. This solid was dissolved in toluene, washed with water, and dried with anhydrous sodium sulfate, and the solvent was distilled away under reduced pressure to obtain a pale yellowish solid (yield 2.3 g/reaction yield 85%).

[Chemical Formula 17]

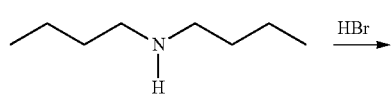

-continued

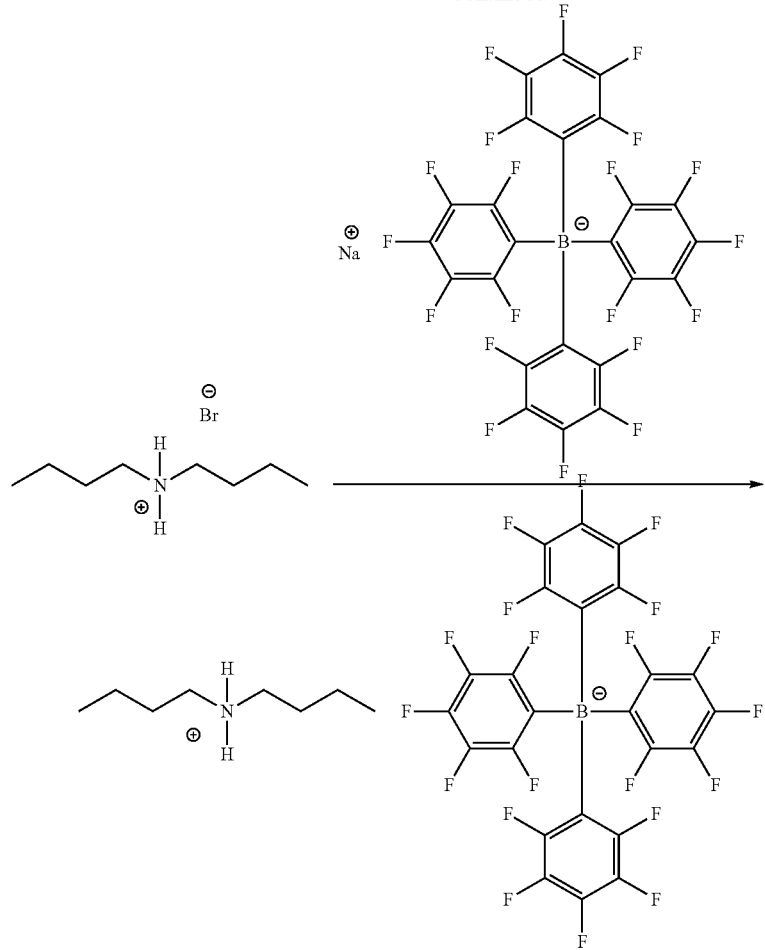

(Synthesis of Ionic Compound 7)

To 0.50 g (3.3 mmol) of N-ethyl-N-methylbenzylamine (I) mixed with 0.56 g of hydrobromic acid (48%), a small amount of acetone was added to provide a homogeneous solution and left overnight, and the acetone was then removed under reduced pressure to obtain a pale yellow oily matter (II). Then, the (II) mentioned above and 23.1 g (3.3 mmol) of sodium tetrakis(pentaphenyl)borate (10% aq.) were mixed, and stirred at 65° C. for 3 hours. A white precipitate produced was thus filtered under reduced pressure, washed with water, and dried to obtain an almost white solid. This solid was dissolved in toluene, washed with water, and dried with anhydrous sodium sulfate, and the solvent was distilled away under reduced pressure to obtain a pale yellowish solid (yield 2.3 g/reaction yield 85%).

[Chemical Formula 18]

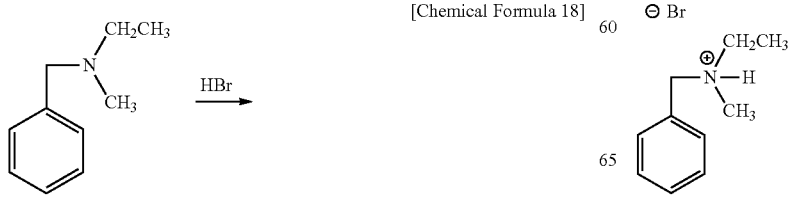

-continued

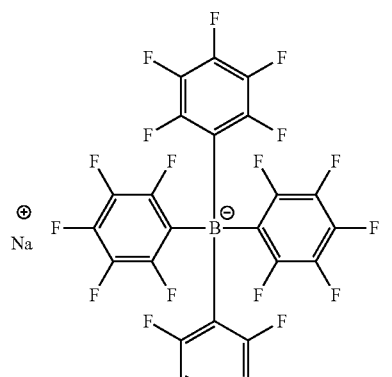

-continued

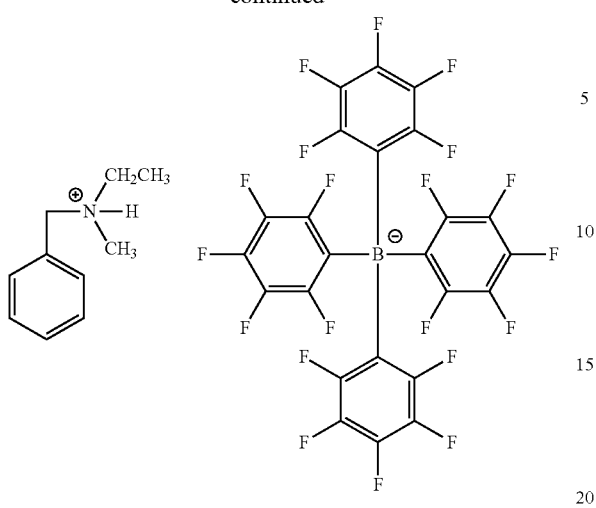

(Synthesis of Ionic Compound 8)

To 5.56 g (30 mmol) of N,N-dimethyl-n-decylamine (I), 75 g of acetone and 15 g of pure water were added, and stirred to provide a homogeneous solution, and 11 g of 10% hydrogen chloride aqueous solution was then slowly delivered by drops into the homogeneous solution, and stirred for 1 hour after the completion of delivering by drops. From this solution, the solvent was distilled away under reduced pressure to obtain a white solid (II). Then, the (II) mentioned above and 232.5 g (33 mmol) of sodium tetrakis(pentaphenyl)borate (10% aq.) were mixed, and stirred for 1 hour. A white precipitate produced was thus washed with water five times, filtered under reduced pressure, washed with water, and dried to obtain an almost white solid. This solid was dissolved in methanol, and reprecipitated in pure water, and the methanol was distilled away under reduced pressure. The solid was filtered under reduced pressure, and then dried under reduced pressure to obtain a white solid (yield 21.3 g/reaction yield 82%).

(Synthesis of Ionic Compound 9)

To 7.24 g (30 mmol) of N,N-dimethyl-n-tetradecylamine (I), 75 g of acetone and 15 g of pure water were added, and stirred to provide a homogeneous solution, and 11 g of 10% hydrogen chloride aqueous solution was then slowly delivered by drops into the homogeneous solution, and stirred for 1 hour after the completion of delivering by drops. From this solution, the solvent was distilled away under reduced pressure to obtain a white solid (II). Then, the (II) mentioned above and 232.5 g (33 mmol) of sodium tetrakis(pentaphenyl)borate (10% aq.) were mixed, and stirred for 1 hour. A white precipitate produced was thus washed with water five times, filtered under reduced pressure, washed with water, and dried to obtain an almost white solid. This solid was dissolved in methanol, and reprecipitated in pure water, and the methanol was distilled away under reduced pressure. The solid was filtered under reduced pressure, and then dried under reduced pressure to obtain a white solid (yield 24.3 g/reaction yield 88%).

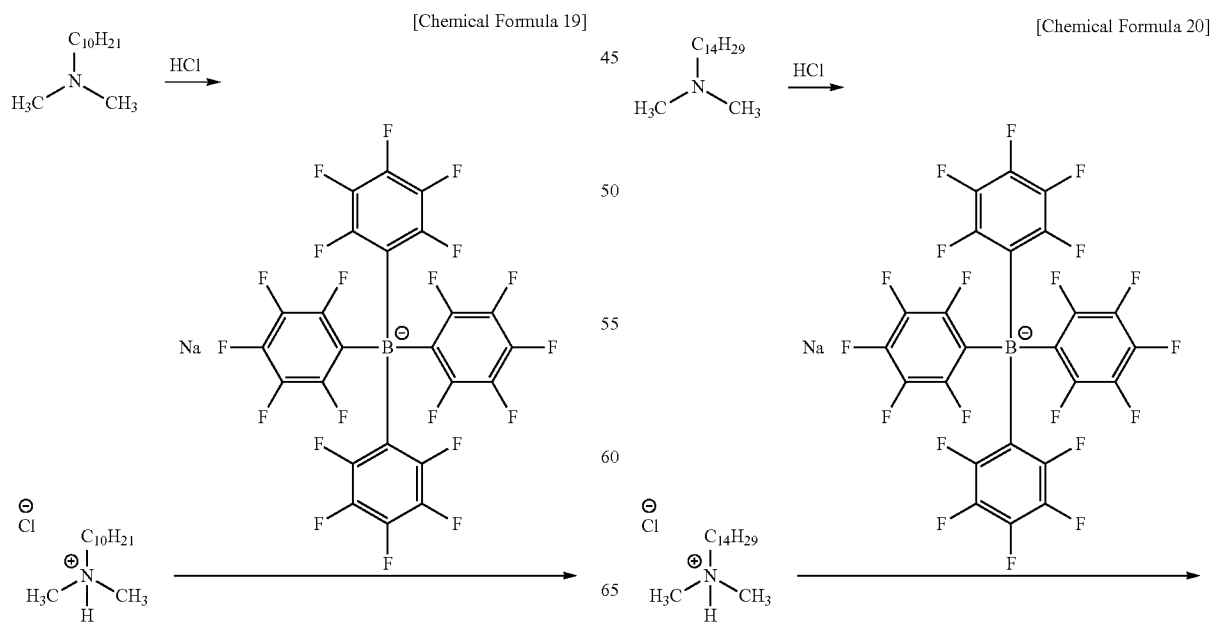

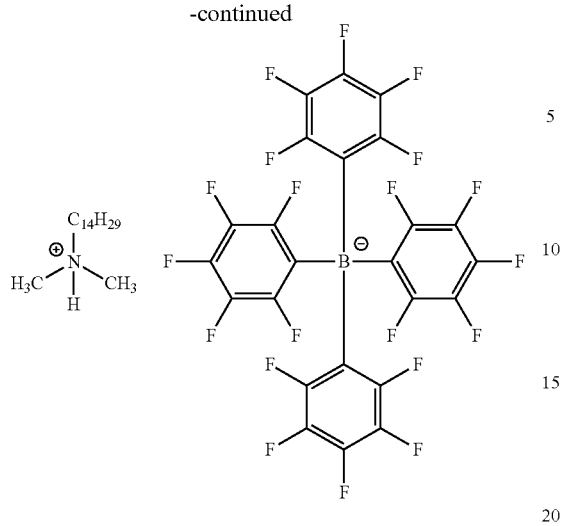
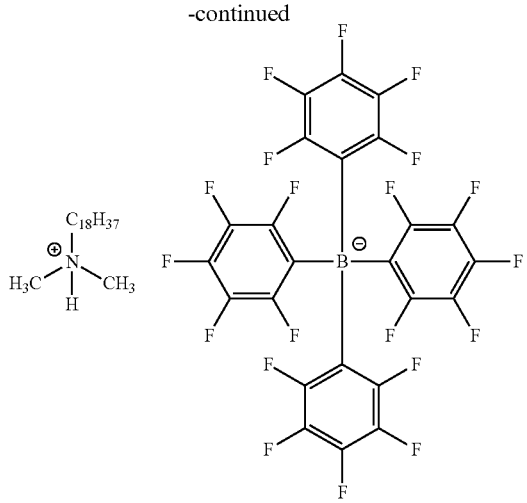

(Synthesis of Ionic Compound 10)

To 8.92 g (30 mmol) of N,N-dimethyl-n-octadecylamine (I), 75 g of acetone and 15 g of pure water were added, and stirred to provide a homogeneous solution, and 11 g of 10% hydrogen chloride aqueous solution was then slowly delivered by drops into the homogeneous solution, and stirred for 1 hour after the completion of delivering by drops. From this solution, the solvent was distilled away under reduced pressure to obtain a white solid (II). Then, the (II) mentioned above and 232.5 g (33 mmol) of sodium tetrakis(pentaphenyl)borate (10% aq.) were mixed, and stirred for 1 hour. A white precipitate produced was thus washed with water five times, filtered under reduced pressure, washed with water, and dried to obtain an almost white solid. This solid was dissolved in methanol, and reprecipitated in pure water, and the methanol was distilled away under reduced pressure. The solid was filtered under reduced pressure, and then dried under reduced pressure to obtain a white solid (yield 25.2 g/reaction yield 86%).

[Chemical Formula 21]

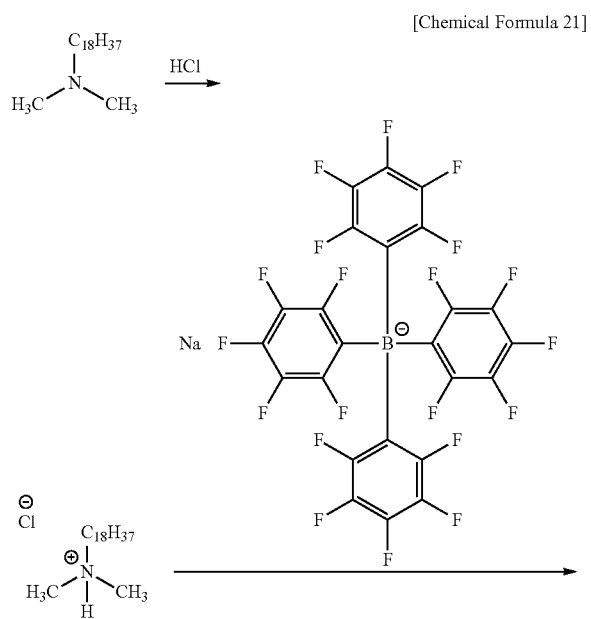

<Synthesis of Charge Transporting Compound>
[Preparation of Pd Catalyst]

In a glove box under a nitrogen atmosphere, under room temperature, tris(dibenzylideneacetone)dipalladium (73.2 mg, 80 μmol) was weighed in a sample tube, and with the addition of anisole (15 ml) thereto, stirred for 30 minutes. Likewise, tris(t-butyl)phosphine (129.6 mg, 640 μmol) was weighed in a sample tube, and with the addition of anisole (5 ml) thereto, stirred for 5 minutes. These solutions were mixed, and stirred at room temperature for 30 minutes to provide a catalyst.

<Synthesis of Charge Transporting Polymer with Cross-Linking Group>

In a three-necked round-bottom flask, the following monomer 1 (4.0 mmol), the following monomer 2 (5.0 mmol), the following monomer 3 (2.0 mmol), and anisole (20 ml) were added, and further added thereto was the prepared Pd catalyst solution (7.5 ml). After stirring for 30 minutes, a solution (20 ml) of 10% tetraethylammonium hydroxide was added. The solvents were all subjected to degassing with nitrogen bubbles for 30 minutes or more, and then used. This mixture was refluxed by heating for 2 hours. These operations were all carried out under a nitrogen stream.

After the completion of the reaction, the organic layer was washed with water, and the organic layer was poured into methanol-water (9:1). The produced precipitate was subjected to suction filtration, and washed with methanol-water (9:1). The obtained precipitate was dissolved in toluene, and reprecipitated from methanol. The obtained precipitate was subjected to suction filtration, dissolved in toluene, and stirred overnight with the addition of triphenylphosphine, polymer-bound on styrene-divinyl benzene copolymer (from Strem Chemicals, Inc., 200 mg with respect to 100 mg of the polymer). After the completion of stirring, the triphenylphosphine, polymer-bound on styrene-divinyl benzene copolymer and the insoluble matter were removed by filtration, and the filtrate was condensed in a rotary evaporator. The residue was dissolved in toluene, and then reprecipitated from methanol-acetone (8:3). The produced precipitate was subjected to suction filtration, and washed with methanol-acetone (8:3). The obtained precipitate was vacuum-dried to obtain the polymer 1. The molecular weight was measured by GPC (polystyrene equivalent) with the use of THF as an eluent. The obtained polymer 1 was 7,800 in number average molecular weight, and 31,000 in weight average molecular weight.

[Chemical Formula 22]

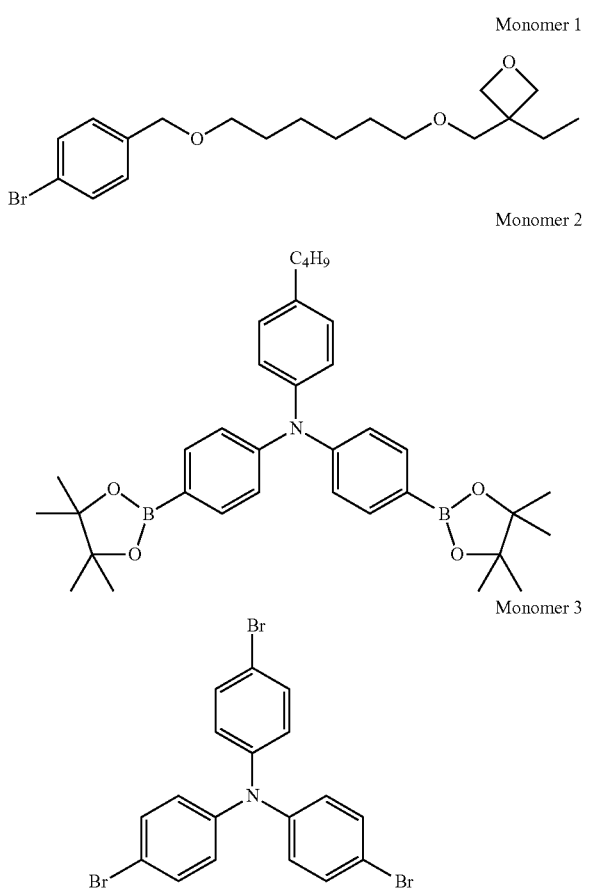

Monomer 1

Monomer 2

Monomer 3

Example 1

Evaluation of Curability

The polymer 1 (5.0 mg) and the ionic compound 1 (0.15 mg) were dissolved in a chlorobenzene solution (1000 μl) to prepare an ink composition. This ink composition was applied onto a quartz plate by spin coating at 3000 rpm. Then, on a hot plate, the composition was heated at 180° C. for 10 minutes to develop a polymerization reaction. After the heating, the quartz plate was immersed in toluene for 1 minute to carry out washing. From the ratio between before and after the washing in the absorbance (Abs) at the absorption maximum (λmax) in UV-vis spectra, the residual film ratio was measured. The measurement result is shown in Table 1.

(Evaluation of Ink Stability)

Under a yellow lamp, the polymer 1 (5.0 mg) and the ionic compound 1 (0.5 mg) were dissolved in an anisole solution (500 μl) to prepare an ink composition. This ink composition was stored at 25° C. for 5 days under a yellow lamp, and the change in viscosity was evaluated with a vibration-type viscometer, whereas the change in color was visually evaluated. The evaluation result is shown in Table 1.

(Evaluation of Charge Transporting Performance)

For evaluating the charge transporting performance, an evaluation element was prepared as follows.

<Preparation of Charge Transporting Performance Evaluation Element>

Onto a glass substrate of 1.6 mm in width, obtained by ITO patterning, a mixed solution of the polymer 1 (100 mg), the ionic compound 1 (3.0 mg), and anisole (1.91 mL) were applied by spin coating at 3000 min$^{-1}$, and heated at 180° C. for 10 minutes on a hot plate to prepare a charge transporting film (150 nm). Next, the obtained glass substrate was transferred into a vacuum deposition machine for vapor deposition of aluminum (100 nm in film thickness).

After the vapor deposition of aluminum, the substrate was transferred into a dry nitrogen atmosphere without being opened to the atmosphere, and sealing was carried out by attaching sealing glass of 0.7 mm alkali-free glass subjected to spot facing at 0.4 mm and the ITO substrate to each other with the use of a light curable epoxy resin, thereby preparing a charge transporting performance evaluation element.

With the ITO of the charge transporting performance evaluation element as a positive electrode and the aluminum thereof as an anode, a voltage was applied. The applied voltage in the case of applying a current at 50 mA/cm$^2$ is shown in Table 1.

Examples 2 to 10

Except that the ionic compound 1 in Example 1 was changed to the ionic compounds 2 to 10, ink compositions were prepared in the same way as in Example 1 to evaluate the curability, ink stability, and charge transporting performance. The evaluation results are shown in Table 1.

Comparative Example 1

Except that the ionic compound 1 in Example 1 was changed to the following ionic compound, an ink composition was prepared in the same way as in Example 1 to evaluate the curability, ink stability, and charge transporting performance. The evaluation results are shown in Table 1.

[Chemical Formula 23]

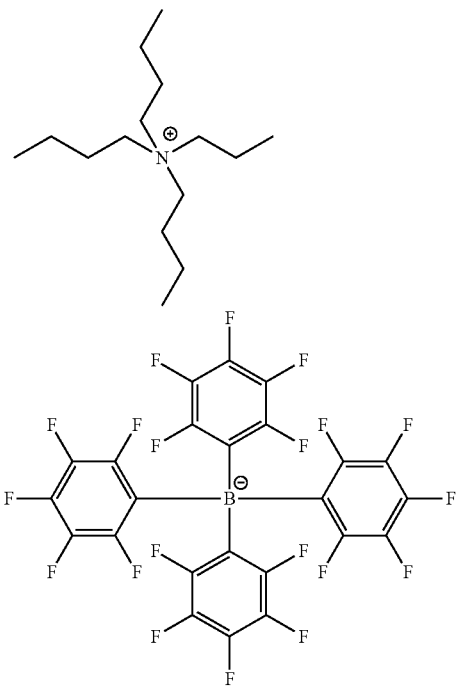

Comparative Example 2

Except that the ionic compound 1 in Example 1 was changed to the following ionic compound, an ink composition was prepared in the same way as in Example 1 to evaluate the curability, ink stability, and charge transporting performance. The evaluation results are shown in Table 1.

[Chemical Formula 24]

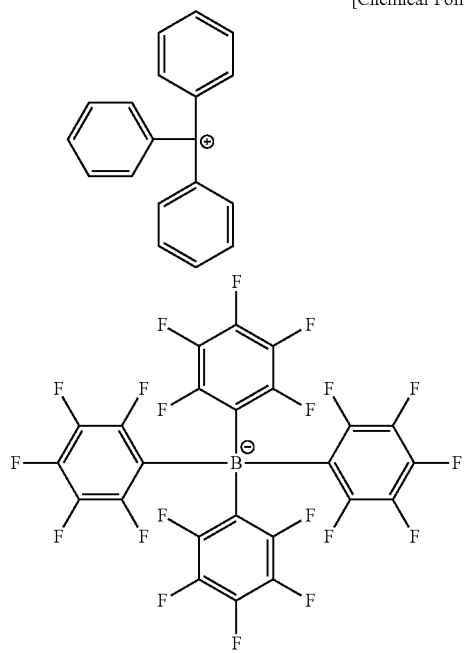

Comparative Example 3

Except that the ionic compound 1 in Example 1 was not added, an ink composition was prepared in the same way as in Example 1 to evaluate the curability, ink stability, and charge transporting performance. The evaluation results are shown in Table 1.

From Table 1, it is determined that favorable results have been achieved for all of the curability, ink stability and charge transporting performance at the same time in Examples 1 to 7, as compared with Comparative Example 1 to 3.

More specifically, curing the deposited layers can develop sufficient resistance to solvents, thereby making it possible to prepare a stacked structure of organic thin films. In addition, it has been confirmed that the material achieves a good balance between curability and ink stability, with high stability in the state of an ink composition.

Furthermore, the organic electronic material according to the present invention, which allows hole current to flow easily, is considered to make a contribution to reduction in voltage for organic electronic elements.

Example 8

Organic EL Element Preparation 1

Onto a glass substrate of 1.6 mm in width, obtained by ITO patterning, an application solution obtained by mixing the polymer 1 (10 mg) obtained above, the ionic compound 1 (0.3 mg), and chlorobenzene (1000 µl) was applied by spin coating at 3000 min$^{-1}$, and then cured by heating at 180° C. for 10 minutes on a hot plate to form a hole injecting layer (30 nm).

Next, the obtained glass substrate was transferred into a vacuum deposition machine for vapor deposition of αNPD (40 nm), (αNPD+Ir(piq)$_3$ (5:1, 20 nm), BAlq (10 nm), Alq$_a$ (40 nm), LiF (0.5 nm in film thickness), and Al (100 nm in film thickness) in this order.

After the formation of the electrode, the substrate was transferred into a dry nitrogen atmosphere without being opened to the atmosphere, and sealing was carried out by attaching sealing glass of 0.7 mm alkali-free glass subjected to spot facing at 0.4 mm and the ITO substrate to each other with the use of a light curable epoxy resin, thereby preparing a high-molecular type organic EL element of multi-layer structure. Subsequent experiments were made at room temperature (25° C.) in the atmosphere. When a voltage was applied with the ITO of the organic EL element as a positive electrode and the Al thereof as a cathode, a red light emission was observed at 3.6 V, and the current efficiency at a luminance of 1000 cd/m$^2$ was 1.5 cd/A. It is to be noted that

TABLE 1

| | | Curability | Ink Stability | | Electron Transporting |
|---|---|---|---|---|---|
| | Ionic Compound | Residual Film Ratio (%) | Color Change | Rate of Viscosity Change (%) | Performance Applied Voltage (V) |
| Example 1 | Ionic Compound 1 | 98.1 | No | <3 | 1.5 |
| Example 2 | Ionic Compound 2 | 95.7 | No | <3 | 2.5 |
| Example 3 | Ionic Compound 3 | 97.2 | No | <3 | 2.8 |
| Example 4 | Ionic Compound 4 | 99.4 | No | <3 | 1.3 |
| Example 5 | Ionic Compound 5 | 99.4 | No | <3 | 1.3 |
| Example 6 | Ionic Compound 6 | 99.1 | No | <3 | 1.5 |
| Example 7 | Ionic Compound 7 | 99.6 | No | <3 | 1.8 |
| Example 8 | Ionic Compound 8 | 99.4 | No | <3 | 1.4 |
| Example 9 | Ionic Compound 9 | 99.6 | No | <3 | 1.5 |
| Example 10 | Ionic Compound 10 | 99.6 | No | <3 | 1.5 |
| Comparative Example 1 | Quaternary Ammonium | 50.1 | No | <3 | 8.2 |
| Comparative Example 2 | TRB | 99.4 | Yes | Gelation | 2.7 |
| Comparative Example 3 | Absent | 32.3 | No | <3 | 36 | current-voltage characteristics were measured with microammeter 4140B from Hewlett-Packard Company, whereas the luminance was measured with the use of a luminance meter Pritchard 1980B from Photo Research, Inc.

Furthermore, as lifetime characteristics, the luminance was measured with BM-7 from Topcon Corporation while applying a constant current, to measure the half-life of the luminance from the initial luminance (3000 cd/m$^2$), which was 420 hours.

Comparative Example 4

Except that the ionic compound 1 was changed to the ionic compound used in Comparative Example 1, an organic EL element was prepared in the same way as in Example 8. A red light emission was observed at 6.2 V, and the current efficiency at a luminance of 1000 cd/m$^2$ was 1.1 cd/A. Furthermore, as lifetime characteristics, the luminance was measured with BM-7 from Topcon Corporation while applying a constant current, to measure the half-life of the luminance from the initial luminance (3000 cd/m$^2$), which was 6 hours.

From the comparison between Example 8 and Comparative Example 4 described above, it is determined that the organic electronic material according to the present invention is also excellent in lifetime characteristics.

Example 9

Organic EL Element Preparation 2

Onto a glass substrate of 1.6 mm in width, obtained by ITO patterning, an application solution obtained by mixing the polymer 1 (10 mg) obtained above, the ionic compound 1 (0.3 mg), and toluene (1000 μl) was applied by spin coating at 3000 min$^{-1}$, and then cured by heating at 180° C. for 10 minutes on a hot plate to form a hole injecting layer (30 nm).

Next, the obtained glass substrate was transferred into a vacuum deposition machine for vapor deposition of αNPD (50 nm), CBP+Ir(ppy)$_3$ (100:6, 30 nm), BAlq (10 nm), Alq$_3$ (30 nm), LiF (0.8 nm in film thickness), and Al (150 nm in film thickness) in this order.

After the formation of the electrode, the substrate was transferred into a dry nitrogen atmosphere without being opened to the atmosphere, and sealing was carried out by attaching sealing glass of 0.7 mm alkali-free glass subjected to spot facing at 0.4 mm and the ITO substrate to each other with the use of a light curable epoxy resin, thereby preparing a high-molecular type organic EL element of multi-layer structure. Subsequent experiments were made at room temperature (25° C.) in the atmosphere. When a voltage was applied with the ITO of the organic EL element as a positive electrode and the Al thereof as a cathode, a green light emission was observed at 4.3 V, and the current efficiency at a luminance of 1000 cd/m$^2$ was 23 cd/A. It is to be noted that current-voltage characteristics were measured with microammeter 4140B from Hewlett-Packard Company, whereas the luminance was measured with the use of a luminance meter Pritchard 1980B from Photo Research, Inc.

Furthermore, as lifetime characteristics, the luminance was measured with BM-7 from Topcon Corporation while applying a constant current, to measure the half-life of the luminance from the initial luminance (3000 cd/m$^2$), which was 520 hours.

Comparative Example 5

Except that the hole injecting layer was changed to PEDOT-PSS (Clevios P AI4083), an organic EL element was prepared in the same way as the foregoing (Organic EL Element Preparation 2). When the evaluation experiment was carried out in the same way as in Example 9, a green light emission was observed at 4.3 V, and the current efficiency at a luminance of 1000 cd/m$^2$ was 21 cd/A. Furthermore, as lifetime characteristics, the luminance was measured with BM-7 from Topcon Corporation while applying a constant current, to measure the half-life of the luminance from the initial luminance (3000 cd/m$^2$), which was 50 hours.

From the comparison between Example 9 and Comparative Example 5 described above, it is determined that the organic electronic material according to the present invention is also excellent in lifetime characteristics.

<Evaluation of Thermal Stability of Ionic Compound>

In a TG-DTA measurement system EXSTAR 6000 from SII NanoTechnology Inc., the temperature of 2 mg of the ionic compound 10 was increased at a rate of temperature increase of 5° C./min while flowing nitrogen (400 ml/min), and the decrease in weight was measured. As a comparison, the following comparative ionic compound was subjected to the measurement under the same conditions. Table 2 shows, for each ionic compound, the temperature for the decrease in weight by 0.5% and the temperature for the decrease in weight by 5%.

[Chemical Formula 25]

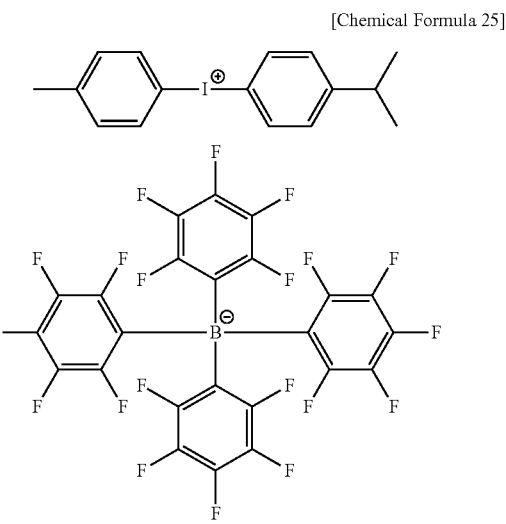

TABLE 2

| | Ionic Compound 10 | Comparative Ionic Compound | Temperature Difference |
|---|---|---|---|
| 0.5% Decrease in Weight | 235° C. | 195° C. | Δ40° C. |
| 5% Decrease in Weight | 276° C. | 221° C. | Δ55° C. |

From Table 2, it is determined that the ionic compound for use in the organic electronic material according to the present invention is excellent in heat resistance. The improvement in thermal stability suppresses material deterioration by baking and damage by volatiles to manufacturing devices, it is expected that high-performance organic EL elements can be manufactured at a high yield.

REFERENCE SIGNS LIST

1 light emitting layer
2 anode
3 hole injecting layer
4 cathode
5 electron injecting layer
6 hole transporting layer
7 electron transporting layer
8 substrate

The invention claimed is:

1. An ink composition comprising an organic electronic material and a solvent, the organic electronic material comprising at least an ionic compound represented by the following general formula (1), and a charge transporting compound including a charge transporting unit:

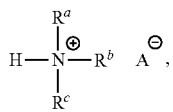

General Formula (1)

wherein in the general formula (1), A represents an anion, and $R^a$ to $R^c$ each independently represent a hydrogen atom (H), an alkyl group, or a benzyl group, provided that at least one condition selected from the group consisting of:
(i) at least two of $R^a$ to $R^c$ each independently represent an alkyl group having 5 or more carbon atoms,
(ii) at least one of $R^a$ to $R^c$ represents a benzyl group, and
(iii) at least one of $R^a$ to $R^c$ represents an alkyl group having 7 or more carbon atoms,
is satisfied.

2. An organic electronic element including a layer formed by applying the ink composition according to claim 1 on a substrate.

3. The organic electronic element according to claim 2, wherein the substrate is a resin film.

4. The ink composition of claim 1, wherein the anion is represented by any one formula selected from the group consisting of the following formulas (1b), (2b), (3b), (4b), and (5b):

(1b)

(2b)

(3b)

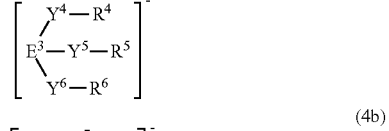

(4b)

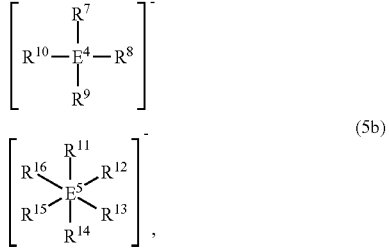

(5b)

wherein in the general formulas (1b) to (5b), $Y^1$ to $Y^6$ each independently represent a divalent linking group; $R^1$ to $R^{16}$ each independently represent an electron attractive organic substituent, these structures may further have substituents and hetero atoms therein, and $R^2$ and $R^3$, $R^4$ to $R^6$, $R^7$ to $R^{10}$, or $R^{11}$ to $R^{16}$ may be each linked to form a ring or a polymer; and $E^1$, $E^2$, $E^3$, $E^4$, and $E^5$ respectively represent an oxygen atom, a nitrogen atom, a carbon atom, a boron atom or a gallium atom, and a phosphorus atom or an antimony atom.

5. The ink composition of claim 1, wherein N is not bonded to an aryl group with the exception of a benzyl group.

* * * * *